(12) United States Patent
Kakiuchi et al.

(10) Patent No.: US 11,367,828 B2
(45) Date of Patent: Jun. 21, 2022

(54) ACTUATOR DEVICE AND LIQUID EJECTION APPARATUS

(71) Applicant: BROTHER KOGYO KABUSHIKI KAISHA, Nagoya (JP)

(72) Inventors: Toru Kakiuchi, Aichi-ken (JP); Yasuo Kato, Aichi-ken (JP); Rui Wang, Nagoya (JP); Yuichi Ito, Mie-ken (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 0 days.

(21) Appl. No.: 17/093,763

(22) Filed: Nov. 10, 2020

(65) Prior Publication Data

US 2021/0057636 A1     Feb. 25, 2021

Related U.S. Application Data

(63) Continuation of application No. 16/379,960, filed on Apr. 10, 2019, now Pat. No. 10,862,019, which is a
(Continued)

(30) Foreign Application Priority Data

Sep. 28, 2016  (JP) ................................ 2016-190054

(51) Int. Cl.
*B41J 2/14*        (2006.01)
*H01L 41/09*     (2006.01)
*H01L 41/047*   (2006.01)

(52) U.S. Cl.
CPC .......... *H01L 41/09* (2013.01); *B41J 2/14233* (2013.01); *H01L 41/0475* (2013.01);
(Continued)

(58) Field of Classification Search
None
See application file for complete search history.

(56) References Cited

U.S. PATENT DOCUMENTS

2005/0174393 A1   8/2005  Mita
2007/0058004 A1   3/2007  Enomoto et al.
(Continued)

FOREIGN PATENT DOCUMENTS

JP       07-226589 A     8/1995
JP       2000-68383 A    3/2000
(Continued)

OTHER PUBLICATIONS

Office Action issued in corresponding Japanese patent application 2016-190054, dated Jul. 21, 2020.
(Continued)

*Primary Examiner* — Erica S Lin
(74) *Attorney, Agent, or Firm* — Merchant & Gould P.C.

(57) ABSTRACT

An actuator device includes: an actuator including piezoelectric elements arranged in a first direction and first contacts arranged in the first direction; a protector including a first wall opposed to the piezoelectric elements and a second wall coupled to the first wall and joined to a region of the actuator at which the first contacts are disposed; first connection terminals disposed on the first; and first through electrodes formed in the second wall to bring the first contacts and the first connection terminals into conduction with each other. A distance between two of the first through electrodes which respectively correspond to two of the piezoelectric elements which are adjacent to each other in the first direction is greater than a distance in the first direction between the two of the piezoelectric elements which are adjacent to each other in the first direction.

12 Claims, 19 Drawing Sheets

Related U.S. Application Data continuation of application No. 15/471,806, filed on Mar. 28, 2017, now Pat. No. 10,297,743.

(52) U.S. Cl.
CPC . *H01L 41/0973* (2013.01); *B41J 2002/14419* (2013.01); *B41J 2002/14491* (2013.01); *B41J 2202/18* (2013.01)

(56) References Cited

U.S. PATENT DOCUMENTS

| | | | |
|---|---|---|---|
| 2007/0064052 A1 | 3/2007 | Sugahara | |
| 2010/0320877 A1* | 12/2010 | Onitsuka | H03H 3/02 310/365 |
| 2011/0169896 A1 | 7/2011 | Miyazawa et al. | |
| 2013/0127955 A1 | 5/2013 | Maka et al. | |
| 2014/0176645 A1* | 6/2014 | Lee | H01L 41/0973 347/68 |

FOREIGN PATENT DOCUMENTS

| | | |
|---|---|---|
| JP | 2002-185140 A | 6/2002 |
| JP | 2004-193385 A | 7/2004 |
| JP | 2006-192685 A | 7/2006 |
| JP | 2007-55243 A | 3/2007 |
| JP | 2007-106112 A | 4/2007 |
| JP | 2009-83286 A | 4/2009 |
| JP | 2009-200294 A | 9/2009 |
| JP | 2015-160359 A | 9/2015 |

OTHER PUBLICATIONS

Office Action (Notice of Reasons for Refusal) issued in corresponding Japanese Patent Application No. 2016-190054, dated Jan. 12, 2021.

Office Action issued in corresponding Japanese Patent Application No. 2021-070839, dated Jan. 25, 2022.

* cited by examiner

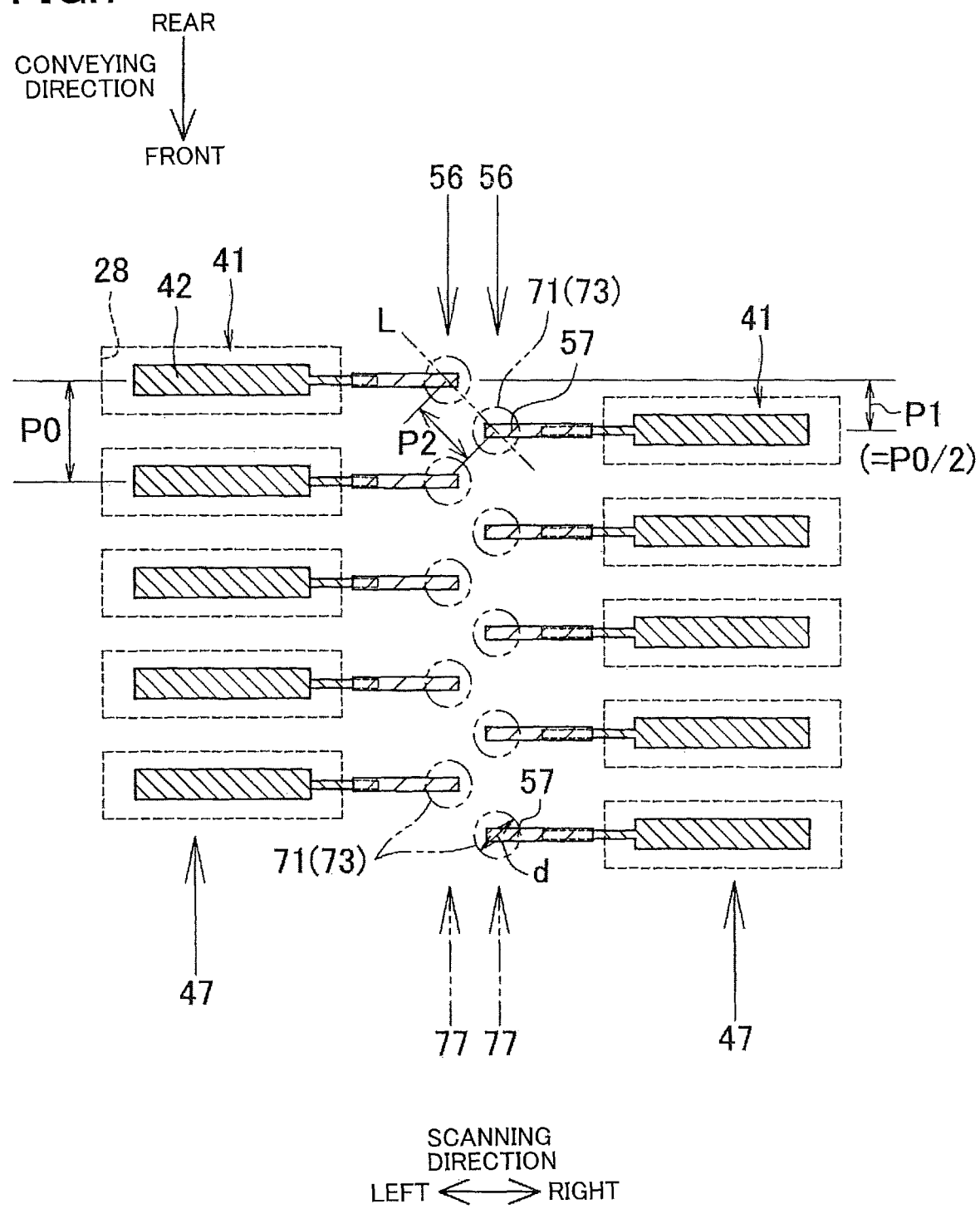

ACTUATOR DEVICE AND LIQUID EJECTION APPARATUS

CROSS REFERENCE TO RELATED APPLICATION

This is a continuation of U.S. patent application Ser. No. 16/379,960, filed Apr. 10, 2019, which is a continuation of U.S. patent application Ser. No. 15/471,806, filed Mar. 28, 2017, which further claims priority from Japanese Patent Application No. 2016-190054, which was filed on Sep. 28, 2016. The disclosures of the aforementioned applications are herein incorporated by reference in their entirety.

BACKGROUND

The following disclosure relates to an actuator device and a liquid ejection apparatus.

There is known a liquid ejection apparatus configured to eject liquid from nozzles. This liquid ejection apparatus includes: a passage definer (a passage forming base plate) having pressure chambers communicating with the respective nozzles; a piezoelectric actuator including piezoelectric elements corresponding to the respective pressure chambers; a protector (a protecting base plate) disposed on the piezoelectric actuator so as to cover the piezoelectric elements; and a drive circuit disposed on an upper surface of the protector.

In this liquid ejection apparatus, contacts drawn out from the respective piezoelectric elements of the piezoelectric actuator are electrically connected to the drive circuit via respective through electrodes extending through the protector.

Specifically, the contacts drawn out from the respective piezoelectric elements are disposed on a portion of the piezoelectric actuator which is joined to the protector. Through holes are formed in a wall of the protector which covers the piezoelectric elements. These through holes are filled with a conductive material to form the through electrodes. The contacts drawn out from the piezoelectric actuator and contacts formed on the upper surface of the protector are respectively electrically connected to each other by the through electrodes. The contacts formed on the upper surface of the protector are connected to the drive circuit by wires formed on the upper surface of the protector.

SUMMARY

Incidentally, a construction in which nozzles and pressure chambers are disposed at high density has been desired in recent years from the viewpoint of size reduction of a liquid ejection apparatus. Here, reduction in arrangement pitches of the pressure chambers reduces arrangement pitches of piezoelectric elements, resulting in smaller arrangement pitches of through electrodes formed on a protector so as to correspond to the respective piezoelectric elements.

Furthermore, size reduction of each of the through electrodes is required to arrange the through electrodes at small pitches. That is, if only the arrangement pitches of the through electrodes are reduced without change in size of each through electrode, a distance between each adjacent two of the through electrodes is reduced, resulting in increased possibility of shorts. In reality, however, there is a limit to reduction in the diameter of each of through holes formed in the protector, making it difficult to reduce the size of each through electrode to a size less than or equal to a particular size.

Accordingly, an aspect of the disclosure relates to a technique for preventing occurrence of shorts between adjacent through electrodes even in a construction in which piezoelectric elements are arranged at a short distance.

In one aspect of the disclosure, an actuator device includes: an actuator including a plurality of piezoelectric elements arranged in a first direction and a plurality of first contacts respectively drawn from the plurality of piezoelectric elements and arranged in the first direction; a protector including (i) a first wall opposed to the plurality of piezoelectric elements and (ii) a second wall coupled to the first wall, the second wall being joined to a region of the actuator at which the plurality of first contacts are disposed, in a state in which the plurality of piezoelectric elements are covered with the protector; a plurality of first connection terminals disposed on a surface of the first wall of the protector, which surface is located on an opposite side of the first wall from the actuator; and a plurality of first through electrodes respectively provided in a plurality of first through holes formed in the second wall of the protector, the plurality of first through electrodes being configured to respectively bring the plurality of first contacts and the plurality of first connection terminals into conduction with each other. A distance between two of the plurality of first through electrodes which respectively correspond to two of the plurality of piezoelectric elements which are adjacent to each other in the first direction is greater than a distance in the first direction between the two of the plurality of piezoelectric elements which are adjacent to each other in the first direction.

In another aspect of the disclosure, a liquid ejection apparatus includes: a passage definer defining therein a plurality of pressure chambers arranged in a first direction and respectively communicating with a plurality of nozzles; an actuator including (a) a plurality of piezoelectric elements respectively corresponding to the plurality of pressure chambers and (b) a plurality of first contacts respectively drawn from the plurality of piezoelectric elements and arranged in the first direction; a protector including (i) a first wall opposed to the plurality of piezoelectric elements and (ii) a second wall coupled to the first wall, the second wall being joined to a region of the actuator at which the plurality of first contacts are disposed, in a state in which the plurality of piezoelectric elements are covered with the protector; a plurality of first connection terminals disposed on a surface of the first wall of the protector, which surface is located on an opposite side of the first wall from the actuator; and a plurality of first through electrodes respectively provided in a plurality of first through holes formed in the second wall of the protector, the plurality of first through electrodes being configured to respectively bring the plurality of first contacts and the plurality of first connection terminals into conduction with each other. A distance between two of the plurality of first through electrodes which respectively correspond to two of the plurality of piezoelectric elements which are adjacent to each other in the first direction is greater than a distance in the first direction between the two of the plurality of piezoelectric elements which are adjacent to each other in the first direction.

BRIEF DESCRIPTION OF THE DRAWINGS

The objects, features, advantages, and technical and industrial significance of the present disclosure will be better understood by reading the following detailed description of the embodiment, when considered in connection with the accompanying drawings, in which:

FIGS. 6A and 6B are cross-sectional views of a separated wall of the protector, wherein FIG. 6A is a cross-sectional view of a portion of the separated wall at which first through electrodes are formed, and FIG. 6B is a cross-sectional view of a portion of the separated wall at which second through electrodes are formed;

FIG. 7 is a view illustrating a positional relationship among piezoelectric elements, driving contacts, and the first through electrodes;

DETAILED DESCRIPTION OF THE EMBODIMENT

Figure 1:
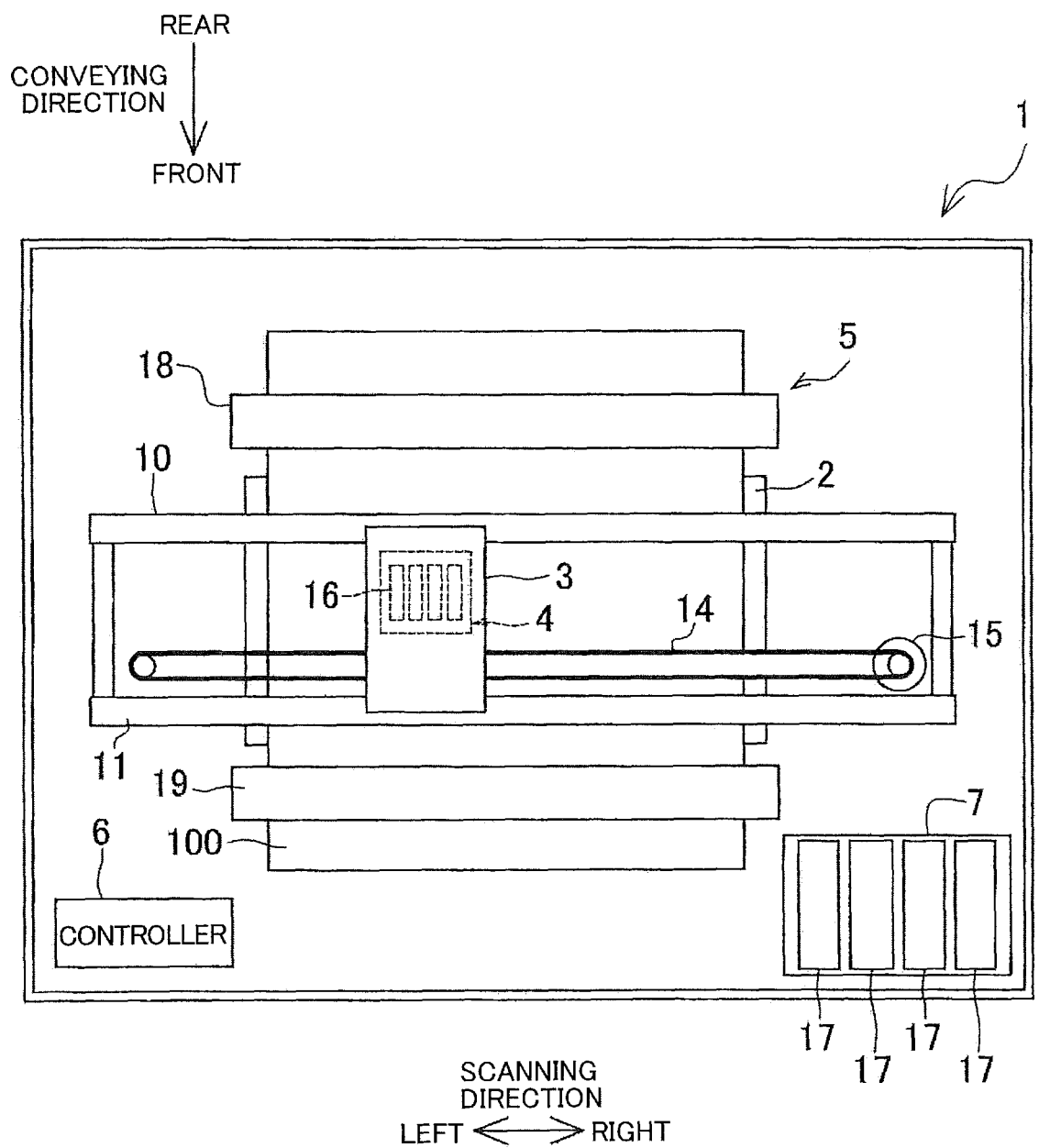
FIG. 1 is a schematic plan view of a printer according to one embodiment.

Hereinafter, there will be described an embodiment by reference to the drawings. First, there will be explained an overall configuration of an ink-jet printer 1 with reference to FIG. 1. The direction in which a recording sheet 100 is conveyed in FIG. 1 is defined as the front and rear direction of the printer 1. The widthwise direction of the recording sheet 100 is defined as the right and left direction of the printer 1. The direction orthogonal to the front and rear direction and the right and left direction and perpendicular to the sheet surface of FIG. 1 is defined as the up and down direction of the printer 1.

Overall Configuration of Printer

As illustrated in FIG. 1, the ink-jet printer 1 includes a platen 2, a carriage 3, an ink-jet head 4, a conveying mechanism 5, and a controller 6.

The carriage 3 is mounted on guide rails 10, 11 extending in the right and left direction (hereinafter may also be referred to as "scanning direction"). The carriage 3 is joined to a carriage driving motor 15 via an endless belt 14. The carriage 3 is driven by the motor 15 and reciprocated in the scanning direction over the recording sheet 100 conveyed on the platen 2.

The ink-jet head 4 is mounted on the carriage 3 and moved in the scanning direction with the carriage 3. The ink-jet head 4 includes four head units 16 arranged in the scanning direction. The four head units 16 are respectively connected to ink cartridges 17 held by a holder 7. The ink cartridges 17 respectively contain inks of four colors, namely, black, yellow, cyan, and magenta.

Each of the head units 16 has a multiplicity of nozzles 36 (see FIGS. 4 and 5) formed in its lower surface (located on a back-surface-side of the sheet of FIG. 1). The inks are supplied from the respective ink cartridges 17 to the respective head units 16, and the head units 16 eject the respective inks onto the recording sheet 100 placed on the platen 2. The construction of the head units 16 will be described later in detail.

The conveying mechanism 5 includes two conveying rollers 18, 19 configured to convey the recording sheet 100 on the platen 2 in the front direction (hereinafter may also be referred to as "conveying direction"). The controller 6 controls devices including the ink-jet head 4 and the carriage driving motor 15 to print an image on the recording sheet 100 based on a print instruction received from an external device such as a personal computer (PC).

Detailed Configuration of Ink-Jet Head

There will be next described the construction of the head units 16 of the ink-jet head 4 in detail. It is noted that the four head units 16 have the same construction, and the following description will be provided for one of the four head units 16 for simplicity.

As illustrated in FIGS. 2-5, the head unit 16 includes a first passage definer 21, a second passage definer 22, a nozzle plate 23, and an actuator device 25. The actuator device 25 includes a piezoelectric actuator 24. In the present embodiment, the actuator device 25 does not indicate only the piezoelectric actuator 24 but includes not only the piezoelectric actuator 24 but also a protector 26, a driver integrated circuit (IC) 37 joined to the protector 26, and a flexible printed circuit (FPC) 27 as one example of a wiring member.

First Passage Definer, Second Passage Definer, and Nozzle Plate

First, the first passage definer 21, the second passage definer 22, and the nozzle plate 23 will be described. Each of these components is a base plate formed of silicon single crystal. The first passage definer 21, the second passage definer 22, and the nozzle plate 23 are stacked on each other in the up and down direction in this order from above.

The first passage definer 21 has a multiplicity of pressure chambers 28 arranged on a horizontal plane. Each of the pressure chambers 28 has a rectangular shape elongated in the scanning direction. The pressure chambers 28 are arranged in the conveying direction so as to form two pressure chamber rows arranged in the scanning direction. Positions of the pressure chambers 28 in the conveying direction are different between the two pressure chamber rows. More specifically, in the case where the arrangement pitch of the pressure chambers 28 in each of the pressure chamber row is defined as P0, the positions of the pressure chambers 28 in the conveying direction are displaced by a distance of P0/2 between the right and left pressure chamber rows.

Figure 5:
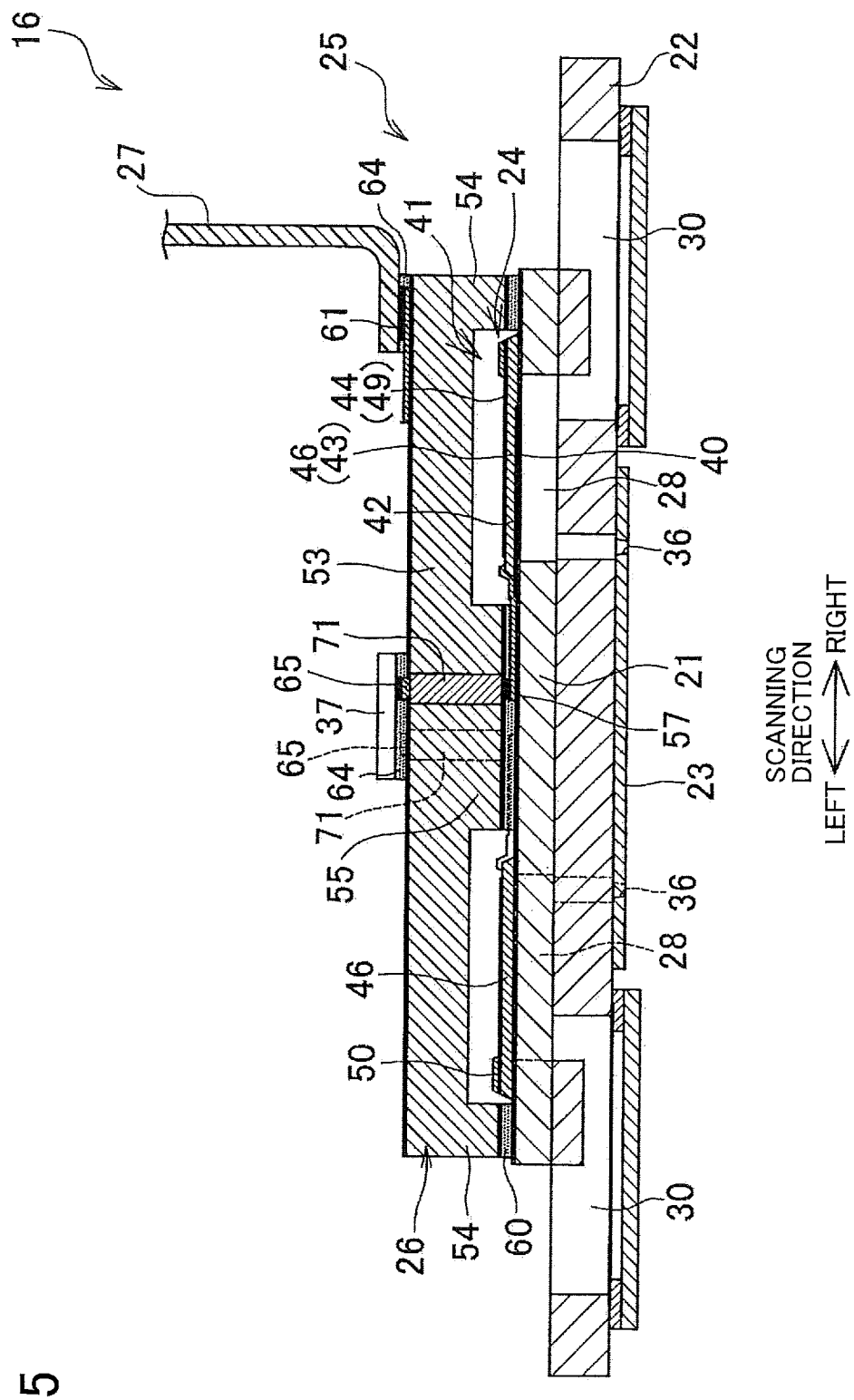
FIG. 5 is a cross-sectional view taken along line V-V in FIG. 4.

As illustrated in FIG. 5, a vibration layer 40 of the piezoelectric actuator 24, which will be described below, is formed on an upper surface of the first passage definer 21 so as to cover the pressure chambers 28. The vibration layer 40 is formed by oxidation or nitriding of a surface of a substrate formed of silicon, for example.

Figure 2:
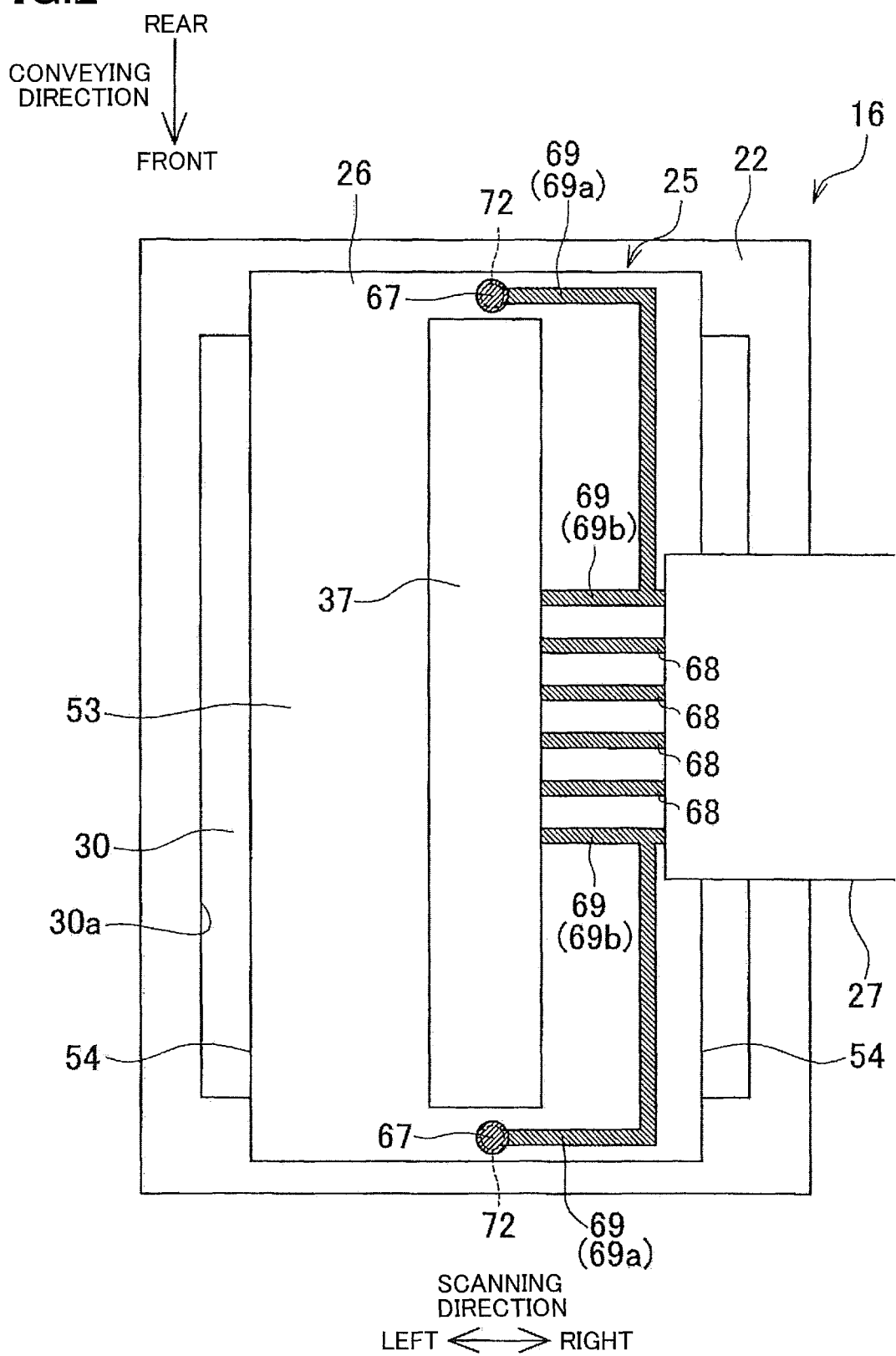
FIG. 2 is a top view of a head unit.
Figure 3:
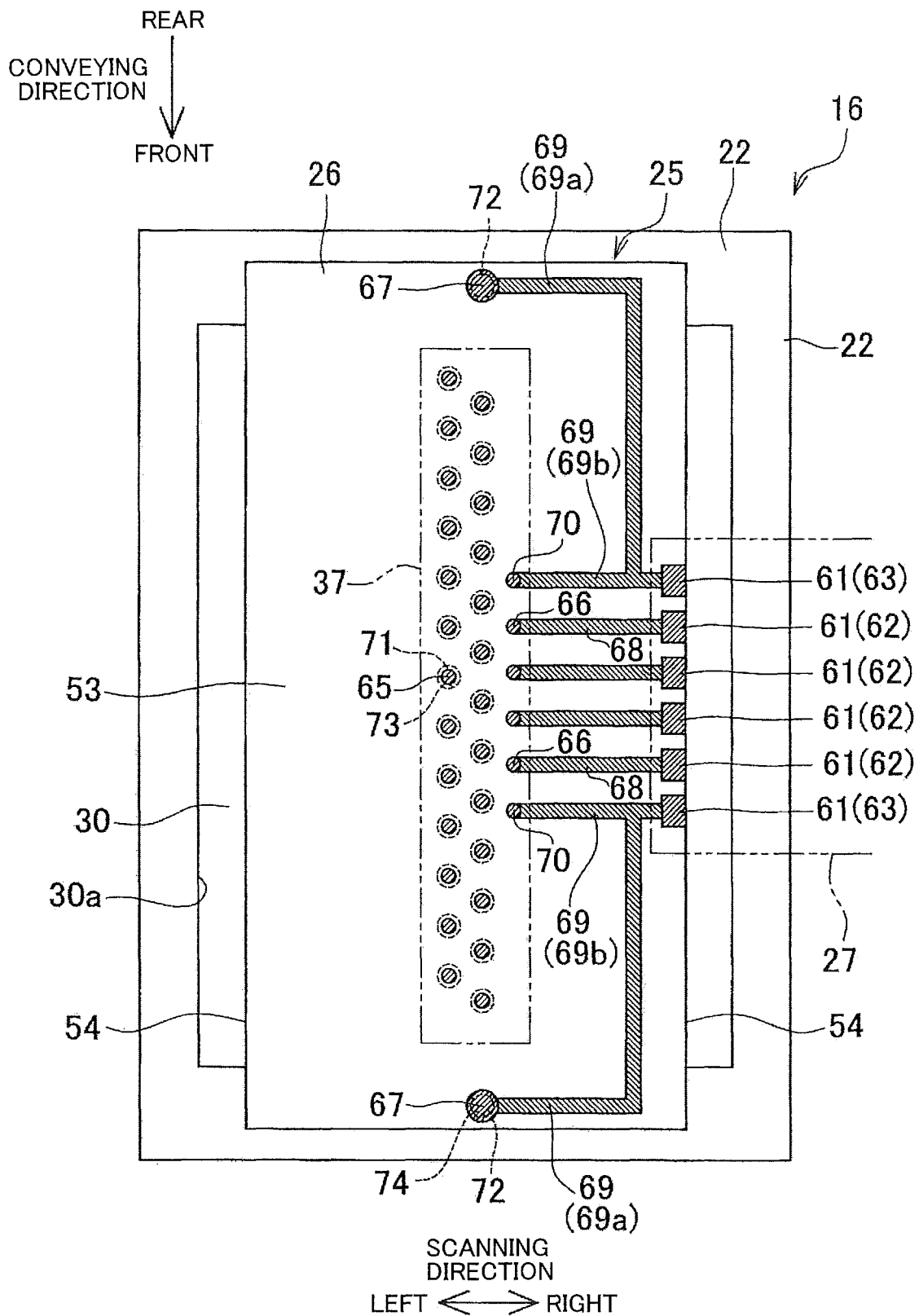
FIG. 3 is a top view of the head unit, with a driver IC and an FPC being simplified.
Figure 4:
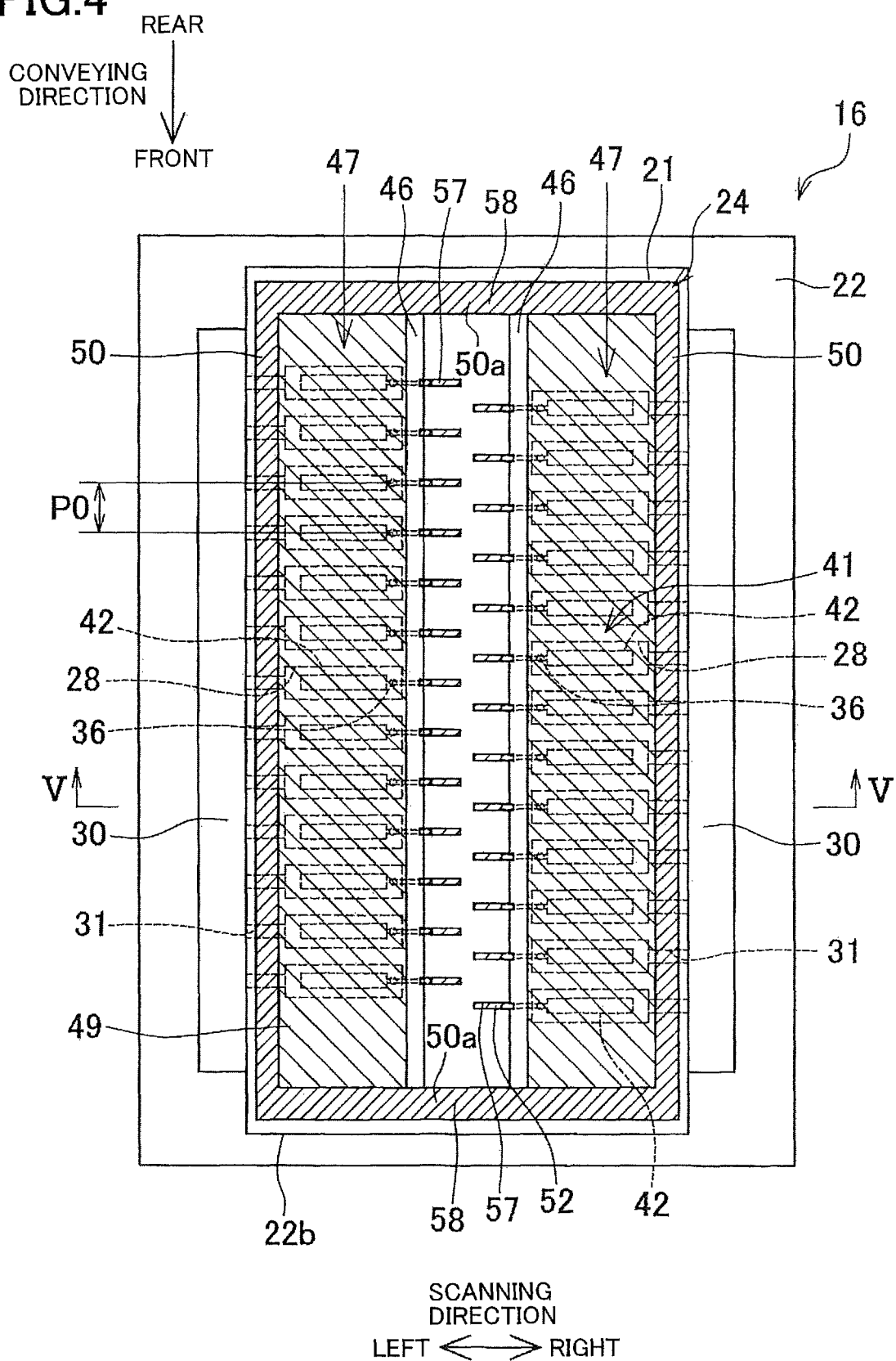
FIG. 4 is a top view of the head unit, without illustration of a protector.

As illustrated in FIGS. 2-4, the second passage definer 22 is one size larger than the first passage definer 21 in plan view and stuck out from the entire perimeter of the first passage definer 21 when viewed from above. As illustrated in FIGS. 4 and 5, two manifolds 30 corresponding to the respective two pressure chamber rows are respectively formed in right and left end portions of the second passage definer 22 which are stuck out from the first passage definer 21. The ink is supplied from the ink cartridge 17 (see FIG. 1) to the two manifolds 30. That is, the two manifolds 30 receive the ink of the same color. Each of the manifolds 30 communicates with the pressure chambers 28 forming a corresponding one of the pressure chamber rows.

The nozzle plate 23 has the nozzles 36 corresponding to the respective pressure chambers 28. The nozzles 36 communicate with the respective pressure chambers 28 formed in the first passage definer 21. The nozzles 36 are arranged in two rows corresponding to the respective two rows of the pressure chambers 28. The positions of the nozzles 36 in the conveying direction are displaced by the distance of P0/2 between the two nozzle rows.

Piezoelectric Actuator Device

The actuator device 25 is disposed on the upper surface of the first passage definer 21. The actuator device 25 includes the piezoelectric actuator 24, the protector 26, the driver IC 37, and the FPC 27. The piezoelectric actuator 24 includes piezoelectric elements 41.

Piezoelectric Actuator

The piezoelectric actuator 24 is disposed on the entire upper surface of the first passage definer 21. As illustrated in FIGS. 4 and 5, the piezoelectric actuator 24 includes the vibration layer 40 and the piezoelectric elements 41 arranged on the vibration layer 40.

As described above, the vibration layer 40 is formed on the upper surface of the first passage definer 21 so as to cover the pressure chambers 28. The vibration layer 40 has a thickness of 1.0 μm to 1.5 μm, for example. The piezoelectric elements 41 are disposed on an upper surface of the vibration layer 40 at positions overlapping the respective pressure chambers 28. In accordance with the arrangement of the pressure chambers 28, the piezoelectric elements 41 form two piezoelectric element rows 47 arranged in the scanning direction. The positions of the piezoelectric elements 41 in the front and rear direction are displaced by the distance of P0/2 between the two piezoelectric element rows 47.

The construction of each of the piezoelectric elements 41 will be described. Each of the piezoelectric elements 41 includes: a lower electrode 42 disposed on the vibration layer 40; a piezoelectric layer 43 disposed on the lower electrode 42; and an upper electrode 44 disposed on the piezoelectric layer 43.

The lower electrodes 42 are disposed on the upper surface of the vibration layer 40 so as to overlap the respective pressure chambers 28. The lower electrodes 42 are individual electrodes separated from each other so as to respectively corresponding to the piezoelectric elements 41. Drive signals are supplied from the driver IC 37 individually to the lower electrodes 42 of the respective piezoelectric elements 41. As illustrated in FIGS. 4 and 7, one end portion of the lower electrode 42 extends inward in the scanning direction so as to be exposed from a corresponding one of piezoelectric members 46. The lower electrodes 42 are formed of platinum (Pt), for example. Each of the lower electrodes 42 has a thickness of 0.1 for example.

The piezoelectric layers 43 are formed of a piezoelectric material such as lead zirconate titanate (PZT). Each of the piezoelectric layers 43 has a thickness of 1.0 μm to 2.0 for example. In the present embodiment, as illustrated in FIGS. 3-5, the piezoelectric layers 43 are connected to each other among the piezoelectric elements 41 in the left piezoelectric element row 47, and the piezoelectric layers 43 are connected to each other among the piezoelectric elements 41 in the right piezoelectric element row 47. That is, the piezoelectric member 46 covering the left pressure chamber row and the piezoelectric member 46 covering the right pressure chamber row are disposed on the vibration layer 40.

The upper electrodes 44 are disposed on upper surfaces of the respective piezoelectric layers 43. The upper electrodes 44 are formed of iridium (Ir), for example. Each of the upper electrodes 44 has a thickness of 0.1 μm, for example. The upper electrodes 44 corresponding to the respective pressure chambers 28 are connected to each other on an upper surface of each of the piezoelectric members 46 so as to form a common electrode 49 covering the substantially entire upper surface of the piezoelectric member 46. It is noted that ground potential is applied to the upper electrodes 44 (the common electrodes 49) from the FPC 27 which will be described below. Subsidiary conductors 50 are provided on the respective common electrodes 49. The thickness of each of the subsidiary conductors 50 is greater than that of each of the common electrodes 49. The subsidiary conductors 50 are formed of gold (Au), for example.

Driving wires 52 are respectively connected to end portions of the respective lower electrodes 42 which are exposed from the piezoelectric member 46. Each of the driving wires 52 extends inward in the scanning direction from the end portion of a corresponding one of the lower electrodes 42. The driving wires 52 are made of gold (Au), for example.

The driving wires 52 extend to a region located between the two piezoelectric element rows 47. Driving contacts 57 are provided on end portions of the respective driving wires 52. The driving contacts 57 of the respective driving wires 52 are arranged in the conveying direction in two rows at the region located between the two piezoelectric element rows 47. More specifically, as illustrated in FIGS. 4 and 7, two contact rows 56 are arranged side by side in the right and left direction between the two piezoelectric element rows 47, and these two contact rows 56 include: a contact row 56 constituted by the driving contacts 57 drawn out from the left piezoelectric element row 47; and a contact row 56 constituted by the driving contacts 57 drawn out from the right piezoelectric element row 47. Like the two piezoelectric element rows 47, the positions of the driving contacts 57 in the front and rear direction are displaced by the distance of P0/2 between the two contact rows 56.

As illustrated in FIG. 4, the two common electrodes 49 disposed on the upper surfaces of the respective two piezoelectric members 46 are connected to each other by electrically-conductive portions 50a of the subsidiary conductors 50 which extend astride the two piezoelectric members 46. Ground contacts 58 are provided on the respective electrically-conductive portions 50a at positions arranged next to the driving contacts 57 in the front and rear direction. That is, the driving contacts 57 and the two ground contacts 58 respectively located in front of and at a rear of the driving contacts 57 in the front and rear direction are disposed between the two piezoelectric element rows 47.

Protector, Driver IC, and FPC

As illustrated in FIGS. 2-5, the protector 26 is joined to an upper surface of the piezoelectric actuator 24 with adhesive so as to cover the piezoelectric elements 41. Conductive adhesive 60 containing conductive particles is used as the adhesive. The material of the protector 26 is not limited in particular. A silicon base is preferably employed for the protector 26.

As illustrated in FIG. 5, the protector 26 includes a top wall 53, two side walls 54, and a separated wall 55. The top wall 53 is opposed to the piezoelectric elements 41. The two side walls 54 are respectively coupled to opposite end portions of the top wall 53 in the right and left direction. Each of the two side walls 54 extends in the front and rear direction (in a direction perpendicular to the sheet surface of FIG. 5). The separated wall 55 is coupled to a central portion of the top wall 53 in the right and left direction and extends in the front and rear direction between the two side walls 54.

The two side walls 54 of the protector 26 are joined to the upper surface of the piezoelectric actuator 24 at its regions respectively located on opposite outer sides of the two piezoelectric element rows 47 in the right and left direction. The separated wall 55 is joined to the upper surface of the piezoelectric actuator 24 at its region located between the two piezoelectric element rows 47, i.e., at its region on which the contacts 57, 58 are disposed. The interior space of the protector 26 is partitioned by the separated wall 55 into two spaces containing the respective right and left piezoelectric element rows 47. In the present embodiment, the width of the separated wall 55 in the right and left direction is greater than that of each of the side walls 54 in the right and left direction.

The driver IC 37 is disposed on an upper surface of the top wall 53 at its central portion in the right and left direction which is coupled to the separated wall 55. The FPC 27 is bonded to the upper surface of the top wall 53 at its right end portion coupled to the right side wall 54.

The protector 26 plays not only a role in protecting the piezoelectric elements 41 but also a role as a component on which wires for connecting between (i) the contacts 57, 58 of the piezoelectric actuator 24 and (ii) the driver IC 37 and the FPC 27 are to be formed. There will be explained a wiring structure of the protector 26 for connecting between (i) the piezoelectric actuator 24 and (ii) the driver IC 37 and the FPC 27.

As illustrated in FIGS. 2 and 3, input terminals 61 arranged in the front and rear direction are disposed on the upper surface of the top wall 53 at its right end portion coupled to the right side wall 54. The input terminals 61 include signal input terminals 62 and ground input terminals 63. The FPC 27 is bonded to a right end portion of the top wall 53 with conductive adhesive 64, so that the FPC 27 and the input terminals 61 are electrically connected to each other. An end portion of the protector 26 which is located on an opposite side thereof from the FPC 27 is connected to the controller 6 (see FIG. 1) of the printer 1.

A plurality of individual terminals 65, two first ground terminals 67, a plurality of signal terminals 66, and two second ground terminals 70 arranged in the front and rear direction are formed on the upper surface of the central portion of the top wall 53 of the protector 26 in the right and left direction, which central portion is coupled to the separated wall 55.

The individual terminals 65 corresponding to the respective driving contacts 57 of the piezoelectric actuator 24 are arranged in two rows in a staggered configuration. The two first ground terminals 67 respectively corresponding to the two ground contacts 58 of the piezoelectric actuator 24 are respectively located on opposite sides of the individual terminals 65 in the front and rear direction. The signal terminals 66 are arranged in the front and rear direction at a region located to the right of the individual terminals 65. The two second ground terminals 70 are respectively located on opposite sides of the individual terminals 65 in the front and rear direction.

The driver IC 37 is joined to the upper surface of the central portion of the top wall 53 in the right and left direction with the conductive adhesive 64, and the individual terminals 65, the signal terminals 66, and the two ground terminals 70 are electrically connected to the driver IC 37.

The signal input terminals 62 connected to the FPC 27 and the signal terminals 66 connected to the driver IC 37 are respectively connected to each other by signal wires 68 extending in the right and left direction on the upper surface of the top wall 53. The ground input terminals 63 are connected to the respective first ground terminals 67 and the respective second ground terminals 70 by respective ground wires 69 (wire portions 69a, 69b) formed on the upper surface of the top wall 53. Specifically, the ground input terminals 63 are connected to the respective first ground terminals 67 by the respective wire portions 69a extending in the right and left direction and in the front and rear direction. The ground input terminals 63 are connected to the respective second ground terminals 70 by the respective wire portions 69b, each of which is branched off from a portion of a corresponding one of the wire portions 69a and extends in the right and left direction. It is noted that the wires and the terminals on the top wall 53, such as the signal wires 68, the ground wires 69, the individual terminals 65, the signal terminals 66, the ground terminals 67, 70, and the input terminals 61, are made of gold (Au), for example.

A plurality of first through electrodes 71 and two second through electrodes 72 are formed in the separated wall 55. The first through electrodes 71 extend in the up and down direction. The two second through electrodes 72 are disposed on opposite sides of the first through electrodes 71 in the front and rear direction. The first through electrodes 71 conduct with the respective driving contacts 57 disposed on the piezoelectric actuator 24 and with the respective individual terminals 65 disposed on the top wall 53 which are located above the driving contacts 57. The second through electrodes 72 conduct with the respective ground contacts 58 disposed on the piezoelectric actuator 24 and with the respective first ground terminals 67 disposed on the top wall 53 which are located above the ground contacts 58.

The controller 6 inputs control signals to the driver IC 37 via the FPC 27, the signal input terminals 62 disposed on the protector 26, the signal wires 68, and the signal terminals 66. The driver IC 37 outputs the drive signal to each of the piezoelectric elements 41 based on the control signals. The drive signals are applied to the respective lower electrodes 42 of the piezoelectric elements 41 via the respective individual terminals 65, the respective first through electrodes 71, and the respective driving contacts 57 of the piezoelectric actuator 24.

Though not illustrated, ground wires are formed on the FPC 27. These ground wires are connected to the common electrodes 49 (the upper electrodes 44) of the piezoelectric actuator 24 via the ground input terminals 63, the wire portions 69*a*, the first ground terminals 67, the second through electrodes 72, and the ground contacts 58. As a result, electric potential of the upper electrodes 44 is kept at ground potential. The ground wires formed on the FPC 27 are also connected to the driver IC 37 via the ground input terminals 63, the wire portions 69*b*, and the second ground terminals 70.

As illustrated in FIGS. 2 and 3, the individual terminals 65 disposed on the top wall 53 correspond to the respective piezoelectric elements 41, and the number of the individual terminals 65 is equal to the number of the driving contacts 57. In contrast, the input terminals 61 (62, 63) connected to the FPC 27 are terminals to which signals principally for controlling the driver IC 37 are to be supplied, and the number of the input terminals 61 is less than the number of the individual terminals 65. Thus, the arrangement length of the input terminals 61 in the front and rear direction is less than that of the individual terminals 65 in the front and rear direction. In addition, in the present embodiment, the width of the FPC 27 in the front and rear direction is less than that of the driver IC 37 in the front and rear direction, resulting in reduced size of the FPC 27 and reduced cost. Also, the reduced width of the FPC 27 facilitates arrangement of the FPC 27.

Details of Through Electrodes

Figure 6A:
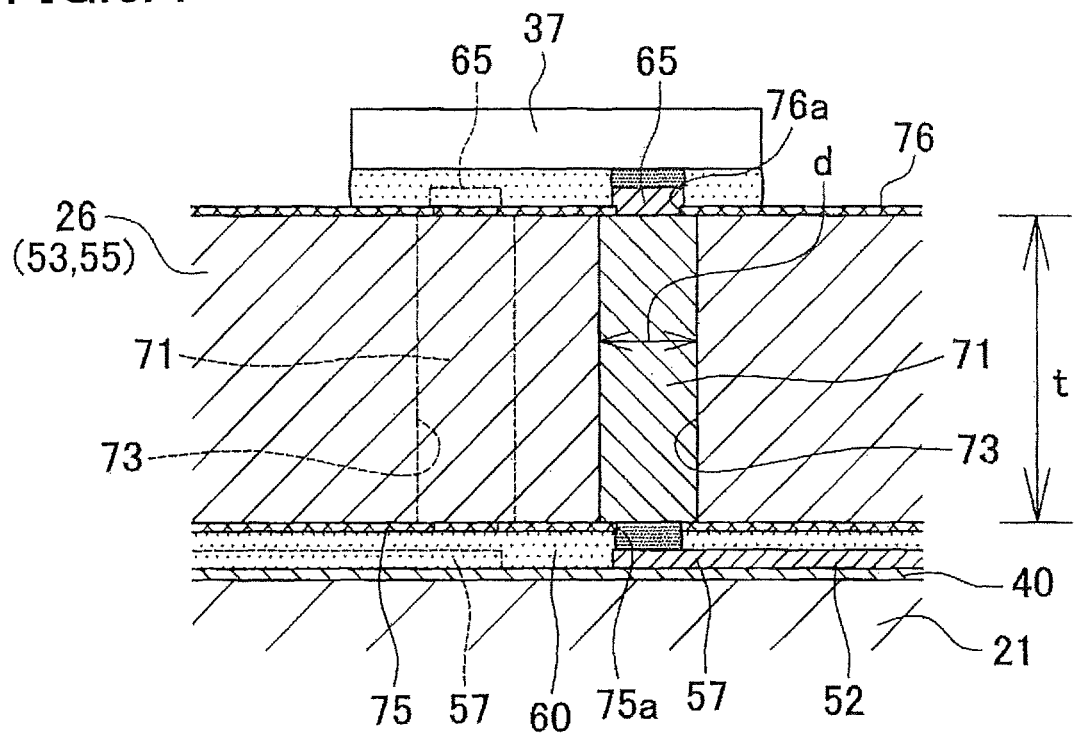

There will be next explained the through electrodes 71, 72 formed in the separated wall 55 of the protector 26. As illustrated in FIGS. 5 and 6A, a plurality of first through holes 73 are formed through the separated wall 55 in the up and down direction at its central portion in the right and left direction so as to overlap the respective driving contacts 57. Each of the first through holes 73 is filled with a conductive material such as copper (Cu), and the first through electrodes 71 each extending in the up and down direction are formed in the respective first through holes 73.

Figure 6B:
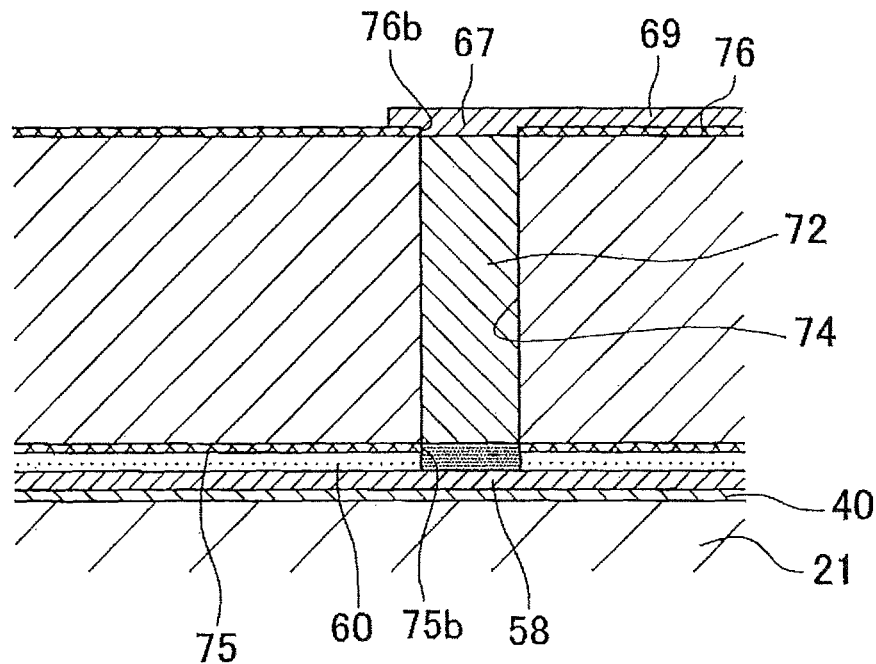

As illustrated in FIGS. 5 and 6B, two second through holes 74 are formed in the separated wall 55 at its central portion in the right and left direction so as to respectively overlap the front and rear ground contacts 58. Like the first through holes 73, each of the two second through holes 74 is filled with the same conductive material as provided in the first through holes 73, and the two second through electrodes 72 each extending in the up and down direction are formed in the respective second through holes 74. In the present embodiment, the diameter of each of the second through holes 74 is equal to that of each of the first through holes 73. That is, the diameter of each of the second through electrodes 72 is equal to that of each of the first through electrodes 71.

Since the driving contacts 57 drawn out from the two piezoelectric element rows 47 are arranged at high density between the two piezoelectric element rows 47, the area of each of the driving contacts 57 is small. As explained later, however, it is difficult to reduce the diameter of each of the first through holes 73 to a size approximately equal to that of each of the driving contacts 57 by etching, so that each of the first through holes 73 has a diameter greater than or equal to a certain diameter. Thus, as illustrated in FIGS. 6A and 7, the area of a lower end face of each of the first through electrodes 71 is greater than the area of the driving contact 57 provided on a distal end portion of a corresponding one of the driving wires 52. More specifically, the diameter of the lower end face of the first through electrode 71 is greater than the width of the driving contact 57 in the front and rear direction. For the same reason, as illustrated in FIGS. 3 and 5, each of the individual terminals 65 disposed on the upper end surface of the top wall 53 is also smaller than a corresponding one of the first through electrodes 71. That is, the area of an upper end face of the first through electrode 71 is greater than that of the area of the individual terminal 65 disposed on the upper surface of the top wall 53.

Since a large amount of current flows in the common electrodes 49 when many piezoelectric elements 41 are driven at the same time, a resistance of paths connected to the common electrode 49 needs to be small in order to prevent a drop in voltage. From this point of view, as illustrated in FIGS. 2, 3, and 6B, the area of each of the ground contacts 58 and the first ground terminals 67 is greater than the area of an end face of a corresponding one of the second through electrodes 72.

In addition, insulating layers 75, 76 are respectively formed on a lower surface of the protector 26 which is joined to the piezoelectric actuator 24 and an upper surface of the protector 26 which is an opposite surface of the protector 26 from the lower surface. Holes 75*a* are formed in the lower insulating layer 75 respectively at positions overlapping the respective first through holes 73. The area of each of the holes 75*a* is less than that of the lower end face of a corresponding one of the first through electrodes 71. That is, the hole 75*a* limits the exposed area of the lower end face of the first through electrode 71 (the area of a portion of the lower end face which is joined to the driving contact 57) to a small area. Holes 76*a* are respectively formed in portions of the upper insulating layer 76 which overlap the respective first through holes 73. The area of each of the holes 76*a* is less than that of an upper end face of a corresponding one of the first through electrodes 71. The hole 76*a* limits the exposed area of the upper end face of the first through electrode 71 (the area of a portion of the upper end face which is joined to the individual terminal 65) to a small area. It is noted that holes 75*b* are formed in the insulating layer 75 at positions respectively overlapping the second through holes 74, and holes 76*b* are formed in the insulating layer 76 at positions respectively overlapping the second through holes 74. The area of each of the holes 75*b*, 76*b* is substantially equal to the area of the end face of each of the second through electrodes 72.

The protector 26 is joined to the upper surface of the piezoelectric actuator 24 with the conductive adhesive 60. The conductive adhesive 60 (ACF or ACP) is formed by mixing conductive particles into thermosetting resin such as epoxy resin. Each of the contacts 57, 58 of the piezoelectric actuator 24 and a corresponding one of the through electrodes 71, 72 formed in the protector 26 electrically conduct with each other by the conductive particles contained in the conductive adhesive 60.

Each of the contacts 57 and the corresponding through electrode 71 are heated and pressed against each other in a state in which the conductive adhesive 60 is interposed between each of the contacts 57 provided on the piezoelectric actuator 24 and the corresponding through electrode 71 provided on the protector 26. Each of the contacts 58 and the corresponding through electrode 72 are heated and pressed against each other in a state in which the conductive adhesive 60 is interposed between each of the contacts 58 provided on the piezoelectric actuator 24 and the corresponding through electrode 72 provided on the protector 26. In these operations, the adhesive 60 is compressed between each of the contacts 57, 58 and the corresponding one of the through electrodes 71, 72, so that each of the contacts 57, 58 and the corresponding one of the through electrodes 71, 72 are electrically connected to each other by the conductive particles contained in the adhesive 60. At the same time, the thermosetting resin as the main components of the adhesive 60 flows out from between each of the contacts 57, 58 and the corresponding one of the through electrodes 71, 72 to areas around the contacts 57, 58 and the through electrodes 71, 72 and is hardened by heat. As a result, the piezoelectric actuator 24 and the protector 26 are mechanically joined to each other. In FIGS. 5-6B, thick hatching indicates portions of the conductive adhesive 60 between the contacts 57, 58 and the respective through electrodes 71, 72, in particular, portions of the conductive adhesive 60 at which the contacts 57, 58 and the respective through electrodes 71, 72 conduct with each other by the conductive adhesive 60 to distinguish the portions from mechanically joined portions therearound.

Incidentally, in particular, from the viewpoint of arrangement of many first through electrodes 71 at high density, the diameter of each of the first through holes 73 is preferably small. In reality, however, there is a limit to reduction of the diameter of each of the first through holes 73.

This limit will be explained, taking a case where the through holes are formed by etching as one example. In the case where the thickness of a component in which holes are to be formed is defined as t, the minimum value of the diameter of each hole formed by etching is about t/10. That is, the diameter of each through hole is prone to increase with increase in the thickness of the component. Here, the protector 26 is originally for protecting the piezoelectric elements 41, and the thickness of greater than or equal to a certain thickness is required for achieving the protecting function. Also, in the case where the thickness of the protector 26 is small, handling when the protector 26 is joined to the piezoelectric actuator 24 is difficult. Thus, the thickness of greater than or equal to a certain thickness is required for the protector 26 also from this viewpoint. In view of the above, in the case where the first through holes 73 are formed by etching, the diameter of each of the formed first through holes 73 is large in some degree.

The large diameter of each first through hole 73 reduces a distance between adjacent two of the first through electrodes 71, resulting in increase in possibility of occurrence of shorts between the adjacent two first through electrodes 71. In particular, in the present embodiment, the protector 26 is joined to the piezoelectric actuator 24 with the conductive adhesive 60, and when the conductive particles contained in the conductive adhesive 60 flow out to the areas around the contacts together with the thermosetting resin, a possibility of shorts due to the conductive particle increases with decrease in the distance between the first through electrodes 71.

To solve this problem, in the present embodiment, the following construction is employed to reduce the distance between the adjacent first through electrodes 71 in the front and rear direction. First, as described above, the driving contacts 57 of the piezoelectric actuator 24 are arranged in a staggered configuration so as to form the two contact rows 56. In accordance with the arrangement of the driving contacts 57, as illustrated in FIGS. 3 and 7, the first through electrodes 71 are also arranged in a staggered configuration so as to form two electrode rows 77 arranged in the right and left direction and each extending in the front and rear direction. As in the two contact rows 56, the positions of the first through electrodes 71 in the front and rear direction are displaced by a distance P1 (which is equal to P0/2) between the two electrode rows 77.

In the present embodiment, as illustrated in FIG. 7, a distance P2 between two of the first through electrodes 71 which are correspond to adjacent two of the piezoelectric elements 41 in the front and rear direction is greater than a distance P1 between the two piezoelectric elements 41. Specifically, the distance between the first through electrodes 71 is the smallest in the case where the first through electrodes 71 are arranged in a direction along a straight line L connecting between the center of the first through electrode 71 in the left electrode row 77 and the center of the first through electrode 71 in the right electrode row 77. In the present embodiment, the distance P2 between the two first through electrodes 71 along the straight line L is greater than the distance P1 (=P0/2) in the front and rear direction between the two piezoelectric elements 41 corresponding to the respective two first through electrodes 71.

Figure 8:
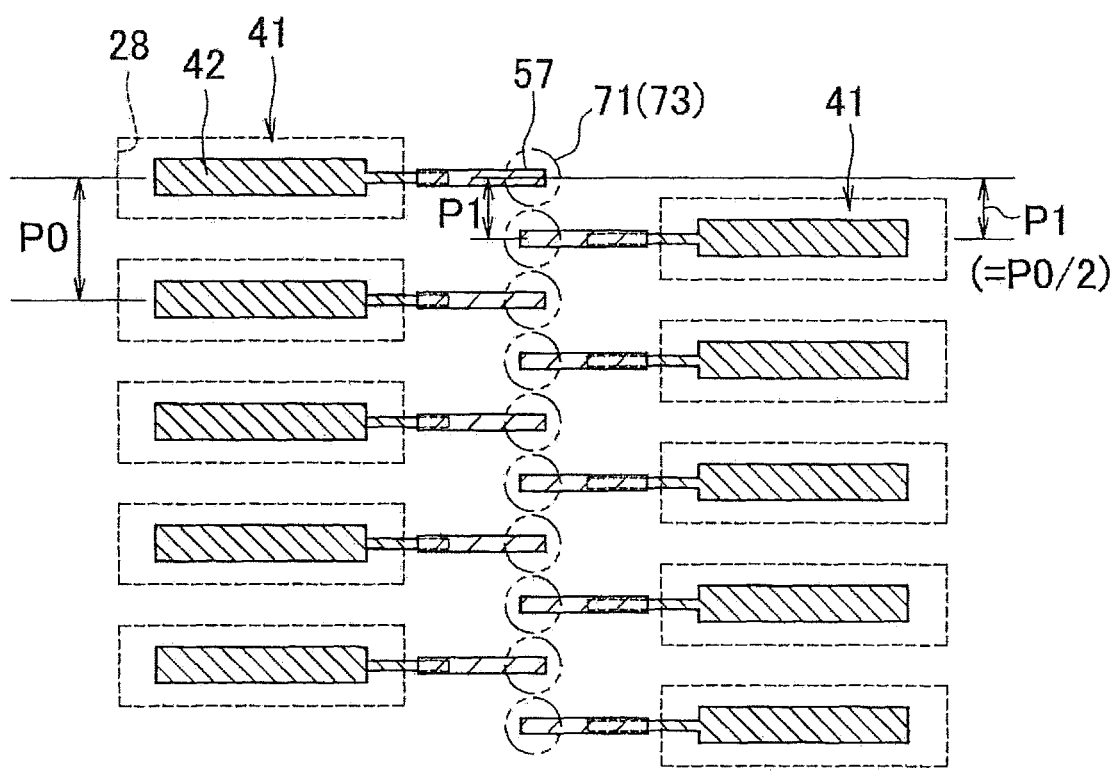
FIG. 8 is a view illustrating a positional relationship among the piezoelectric elements, the driving contacts, and the first through electrodes in a comparative example.
Figure 9A:
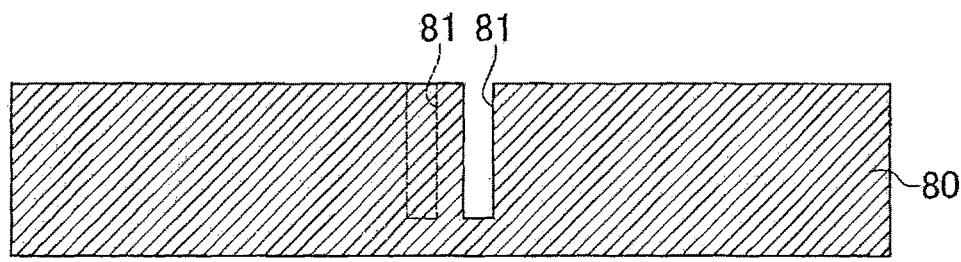
FIGS. 9A through 9F are views illustrating a process of producing the protector.
Figure 9B:
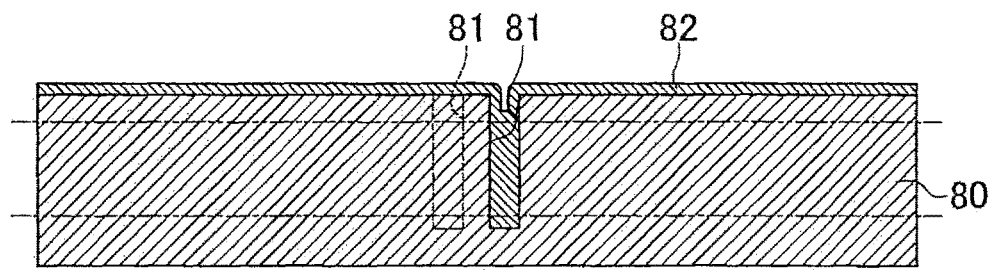
Figure 9C:
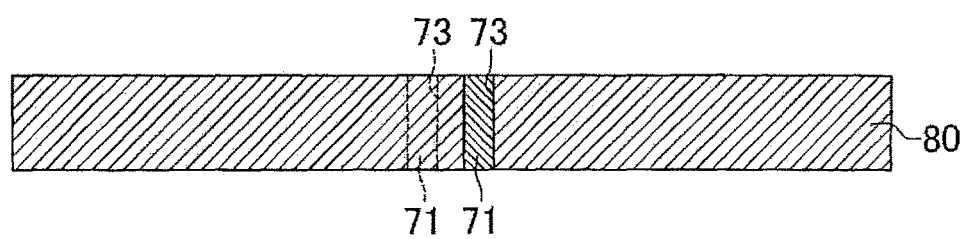
Figure 9D:
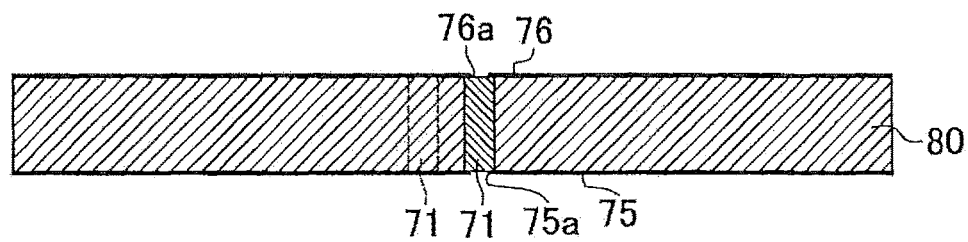
Figure 9E:
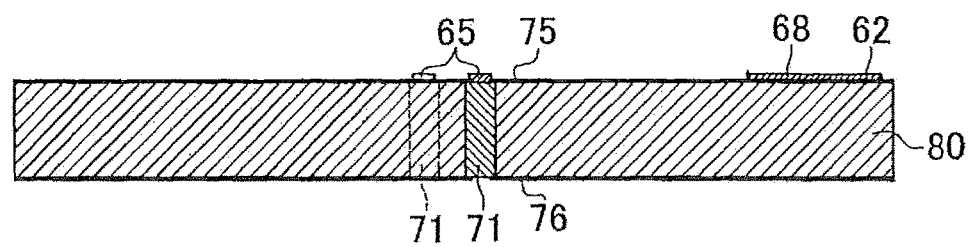
Figure 9F:
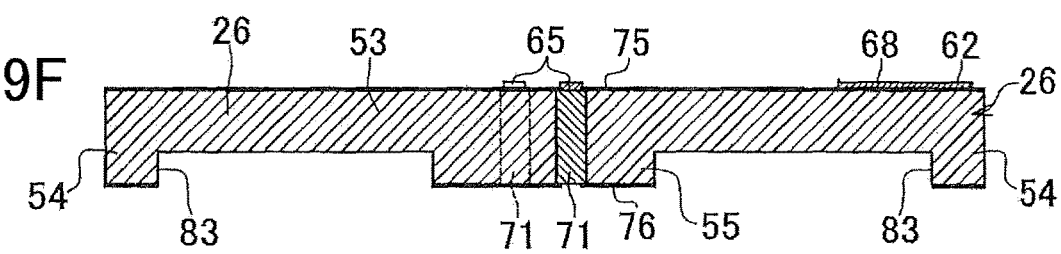

FIG. 8 illustrates a comparative example of the construction in FIG. 7. In the example in FIG. 8, the driving contacts 57 drawn out from the two piezoelectric element rows 47 are arranged in a row in the front and rear direction at the intervals P1. In this construction, the distance between the closest two first through electrodes 71 is P1. In the construction in FIG. 7 in the present embodiment, in contrast, the distance between the closest two first through electrodes 71 is greater than P1. In other words, in the present embodiment, the driving contacts 57 provided on the piezoelectric actuator 24 are divided into the right and left contact rows 56, and the first through electrodes 71 provided on the protector 26 are divided into the right and left electrode rows 77, whereby the shortest distance between the adjacent first through electrodes 71 is large.

For example, as described above, in the case where the thickness t of the protector 26 is 400 the diameter d of each of the first through holes 73 is 40 μm (=t/10) at the shortest. In the case where the arrangement pitch P0 of the nozzles 36 in each of the nozzle rows is 300 dpi (=84 μm), the distance P1 between the two piezoelectric elements 41 adjacent to each other in the front and rear direction is P0/2 (=42 μm). In this case, if the first through electrodes 71 are arranged in a row at the pitches of P1 in the front and rear direction as illustrated in FIG. 8, little space remains between the two first through electrodes 71 adjacent to each other in the front and rear direction. As illustrated in FIG. 7, in contrast, in the case where the first through electrodes 71 are arranged in the right and left electrode rows 77, the distance P2 between the first through electrodes 71 close to each other can be increased to about 60 μm.

Thus, the distance P2 between the two first through electrodes 71 respectively corresponding to the two piezoelectric elements 41 adjacent to each other in the front and rear direction is greater than the distance P1 between the two piezoelectric elements 41 in the front and rear direction. With this construction, even in the case where the arrangement pitch P0 in the one nozzle rows is considerably small (e.g., 300 dpi), it is possible to prevent shorts between the two first through electrodes 71 adjacent to each other.

As illustrated in FIG. 6A, the lower end face of each of the first through electrodes 71 is covered with the insulating layer 75 having the small holes 75a, whereby the area of the lower end face of each of the first through electrodes 71 is substantially made smaller. In this construction, the space between the adjacent first through electrodes 71 is large at their lower ends joined to the respective driving contacts 57, thereby more reliably preventing shorts. The above-described construction is effective in particular in the case where the area of the lower end face of each of the first through electrodes 71 is greater than the area of the corresponding driving contact 57.

Also, the upper end faces of the respective first through electrodes 71 are covered with the insulating layer 76 having the small holes 76a, whereby the area of each of the upper end faces of the respective first through electrodes 71 is substantially made smaller. As a result, the space between the adjacent first through electrodes 71 is also large at their upper ends joined to the driver IC 37, thereby more reliably preventing shorts.

To reduce the resistance of the paths connected to the common electrodes 49, as illustrated in FIG. 3, a plurality of the second through electrodes 72 are preferably provided for connection to the common electrodes 49. It is noted that it is possible to lower the resistance of the paths connected to the common electrodes 49 by making the diameter of each of the second through holes 74 greater than that of each of the first through holes 73. However, in the case where the first through holes 73 and the second through holes 74 have the same diameter as in the present embodiment, when the first through holes 73 and the second through holes 74 are formed by etching, shapes of masks need not be different from each other, facilitating formation of the holes.

However, it is not preferable to increase the number of the second through electrodes 72 more than needed, because this increase leads to larger sizes of the piezoelectric actuator 24 and the protector 26. To solve this problem, the number of the second through electrodes 72 and the diameter of each of the second through electrodes 72 may be determined based on the following expression, for example.

Here, the number of the second through electrodes 72 and the diameter of each of the second through electrodes 72 are determined such that a current greater than an allowable current value does not pass through the second through electrodes 72 even in the case where the maximum amount of current is supplied to the paths connected to the common electrodes 49 by simultaneous driving of all the piezoelectric elements 41. That is, in the case where the maximum amount of current flowing from each piezoelectric element 41 to the common electrode 49 is I, the number of the piezoelectric elements 41 connected to the common electrode 49 is n, the allowable current density of the material of the second through electrodes 72 is i, the cross-sectional area of each second through electrode 72 is A, and the number of the second through electrodes 72 is N, the number of the second through electrodes 72 and the diameter of each of the second through electrodes 72 are determined so as to satisfy a relationship "N>(I×n)/(i×A)".

There will be explained selection of the number of the second through electrodes 72 by way of specific example. It is assumed that the maximum amount of current I flowing from one piezoelectric element 41 to the common electrode 49 is 10 mA (=$1.0\times10^{-2}$ A), the allowable current density i of copper (Cu) forming the second through electrodes 72 is $0.5\times10^4$ A/mm$^2$, and the number n of the piezoelectric elements 41 (the number of the nozzles 36) is 800. In this case, the number of the required second through electrodes 72 changes as follows, depending upon the diameter d of the through hole 74.

In the case where the diameter d is 40 μm, the cross-sectional area A is $1.3\times10^{-3}$ mm$^2$, and the number N is greater than 1.23. Two second through electrodes 72 are required at the least. In the case where the diameter d is 30 μm, the cross-sectional area A is $7.1\times10^{-4}$ mm$^2$, and the number N is greater than 2.25. Three second through electrodes 72 are required at the least. In the case where the diameter d is 20 μm, the cross-sectional area A is $3.1\times10^{-4}$ mm$^2$, and the number N is greater than 5.1. Six second through electrodes 72 are required at the least.

It is noted that the above-described expression indicates the minimum number of required second through electrodes 72. Thus, in reality, the number of the second through electrodes 72 is preferably the number obtained by adding one or more to the number N obtained according to the above-described expression for the sake of reliability.

The driver IC 37 is pressed against and joined to the individual terminals 65 disposed on the top wall 53. To prevent deformation of the top wall 53 due to a pressing force of the driver IC 37 during its joining, the individual terminals 65 are preferably provided on the right and left end portions of the top wall 53 which are coupled to the respective side walls 54 or on the central portion of the top wall 53 which is coupled to the separated wall 55. In the present embodiment, the individual terminals 65 are disposed on the central portion of the top wall 53.

In the present embodiment, the separated wall 55 has the first through electrodes 71 that conduct with the respective individual terminals 65 disposed just above the respective first through electrodes 71. In this construction, the first through electrodes 71 drawn out from the two piezoelectric element rows 47 located on opposite sides of the separated wall 55 are intensively disposed on the separated wall 55, resulting in reduced sizes of the piezoelectric actuator 24 and the protector 26 in the right and left direction.

As illustrated in FIG. 5, the first through electrodes 71 and the second through electrodes 72 are formed on the central portion of the separated wall 55 in the right and left direction. With this construction, even in the case where the pressing force acts on the separated wall 55 during joining of the driver IC 37, it is difficult for a bending force to act on the through electrodes 71, 72 disposed in the separated wall 55, thereby preventing breakage of the through electrodes 71, 72.

The FPC 27 is pressed against and joined to the input terminals 61 disposed on the top wall 53. Like the individual terminals 65, the input terminals 61 are preferably provided on portions of the top wall 53 which are coupled to the side walls 54 or the separated wall 55 to prevent deformation of the top wall 53 due to the pressing force during joining of the FPC 27. In the present embodiment, the input terminals 61 are formed on the right end portion of the top wall 53 which is coupled to the right side wall 54.

There will be next explained a process of producing the head unit 16 with reference to FIGS. 9A-10I, mainly focusing on a process of producing the protector 26 and a process of joining the protector 26 to the piezoelectric actuator 24. It is noted that the following steps A-I respectively correspond to FIGS. 9A-10I.

There will be next explained the process of producing the protector 26 with reference to FIGS. 9A-9F. In step A, recessed holes 81 that are to serve as the first through holes 73 are formed by etching in a silicon single crystal substrate 80 that is to serve as the protector 26. In step B, a conductive layer 82 is formed on the substrate 80 by, e.g., spattering from a side of the substrate 80 on which the holes 81 are formed. The conductive material forming the conductive layer 82 partly enters the holes 81. In step C, the substrate 80 is ground from its opposite sides to the two two-dot chain lines indicated in FIG. 9B to remove opposite end portions of each of the holes 81. As a result, the first through electrodes 71 filled with the conductive material are formed in the respective first through holes 73.

In step D, the insulating layers 75, 76 are respectively formed on the lower surface and the upper surface of the substrate 80 after the grinding. The insulating layers 75, 76 are also etched to form the holes 75a, 76a each smaller than a corresponding one of the first through holes 73. In step E, the wires and the terminals such as the signal input terminals 62, the individual terminals 65, and the signal wires 68, are formed on the upper surface of the substrate 80 by plating with, e.g., gold (Au) or patterning of a thin layer of aluminum (Al). In step F, a lower portion of the substrate 80 is etched to form recesses 83. As a result, the production of the protector 26 including the top wall 53, the two side walls 54, and the separated wall 55 is finished.

Figure 10G:
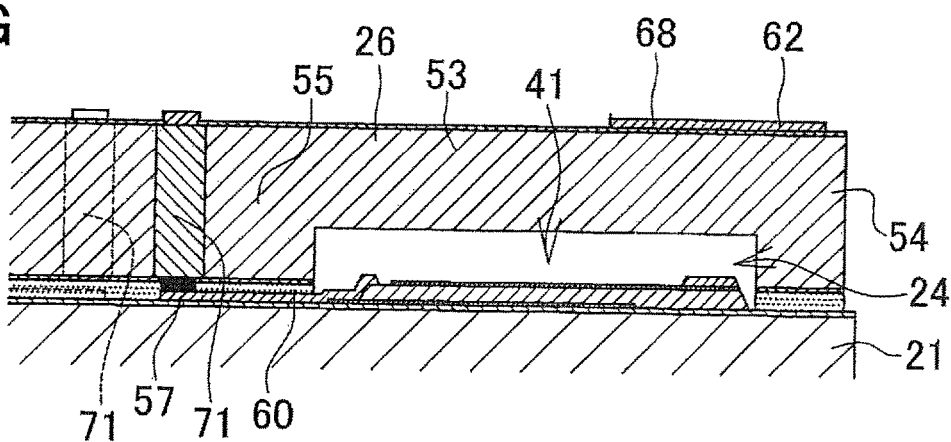
FIGS. 10G through 10I are views illustrating a process from joining of the protector to joining of the driver IC and the FPC.
Figure 10H:
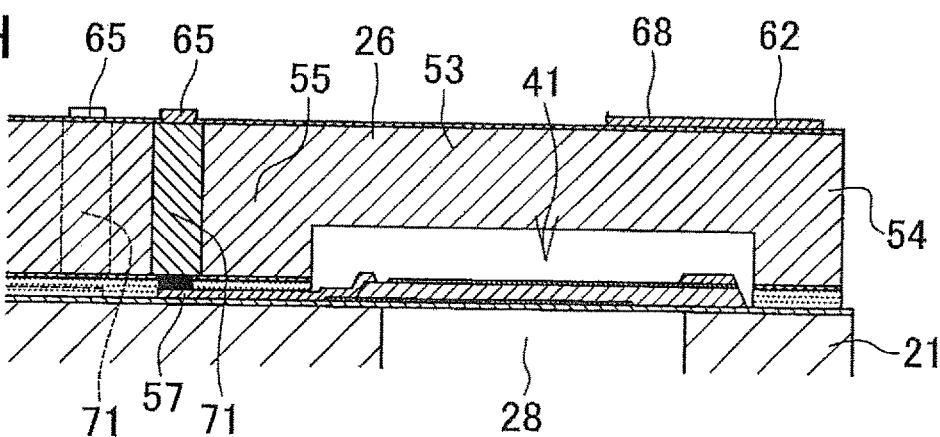
Figure 10I:
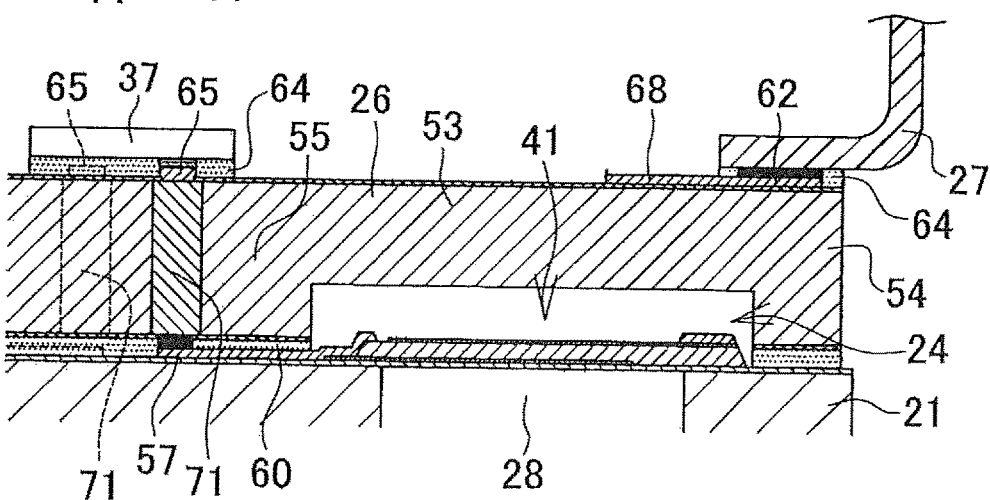

There will be next explained, with reference to FIGS. 10G-10I, processes from the process of joining the protector 26 to a process of joining the driver IC 37 and the FPC 27. In step G, the conductive adhesive 60 (ACF or ACP) is applied to the lower surface of the protector 26, and then the protector 26 is heated and pressed against the piezoelectric actuator 24 including the piezoelectric elements 41. As a result, the protector 26 is mechanically joined to the piezoelectric actuator 24 in a state in which the driving contacts 57 and the first through electrodes 71 conduct with each other.

In step H, the first passage definer 21 is ground to reduce its thickness to a particular thickness, and thereafter the first passage definer 21 is etched to form the pressure chambers 28. In step I, the driver IC 37 is joined to the central portion of the top wall 53 of the protector 26 with the conductive adhesive 64. The FPC 27 is thereafter joined to the right end portion of the protector 26 with the conductive adhesive 64. It is noted that the joining of the driver IC 37 and the joining of the FPC 27 may be performed at the same time.

In the embodiment described above, the head unit 16 is one example of a liquid ejection apparatus. The front and rear direction in which the piezoelectric elements 41 are arranged is one example of a first direction. The right and left direction parallel with a plane on which the piezoelectric elements 41 are arranged and orthogonal to the front and rear direction is one example of a second direction. The piezoelectric actuator 24 is one example of an actuator. Each of the driving contacts 57 is one example of a first contact. Each of the ground contacts 58 is one example of a second contact. The top wall 53 of the protector 26 is one example of a first wall. Each of the side walls 54 and the separated wall 55 is one example of a second wall. Each of the individual terminals 65 formed on the top wall 53 is one example of a first connection terminal. Each of the first ground terminals 67 is one example of a second connection terminal. Each of the input terminals 61 is one example of a third connection terminal. The insulating layer 75 is one example of a first insulating layer. The insulating layer 76 is one example of a second insulating layer. Each of the lower electrodes 42 of the respective piezoelectric elements 41 is one example of a first electrode. Each of the upper electrodes 44 of the respective piezoelectric elements 41 is one example of a second electrode. The driver IC 37 is one example of a drive circuit. The FPC 27 is one example of a wiring member.

While the embodiment has been described above, it is to be understood that the disclosure is not limited to the details of the illustrated embodiment, but may be embodied with various changes and modifications, which may occur to those skilled in the art, without departing from the spirit and scope of the disclosure. It is noted that the same reference numerals as used in the above-described embodiment are used to designate the corresponding elements of the modifications, and an explanation of which is dispensed with.

In the case where the first through holes are formed in the protector by etching, each hole easily tapers down toward a deep side in a direction of travel of the etching. In a modification, as illustrated in a protector 26A in FIG. 11, first through holes 73A are preferably formed by etching the protector 26A from an opposite side (an upper side) of the protector 26A from a side on which a piezoelectric actuator 24A is located such that the diameter of each of the first through holes 73A decreases with decrease in distance to the piezoelectric actuator 24A.

Figure 11:
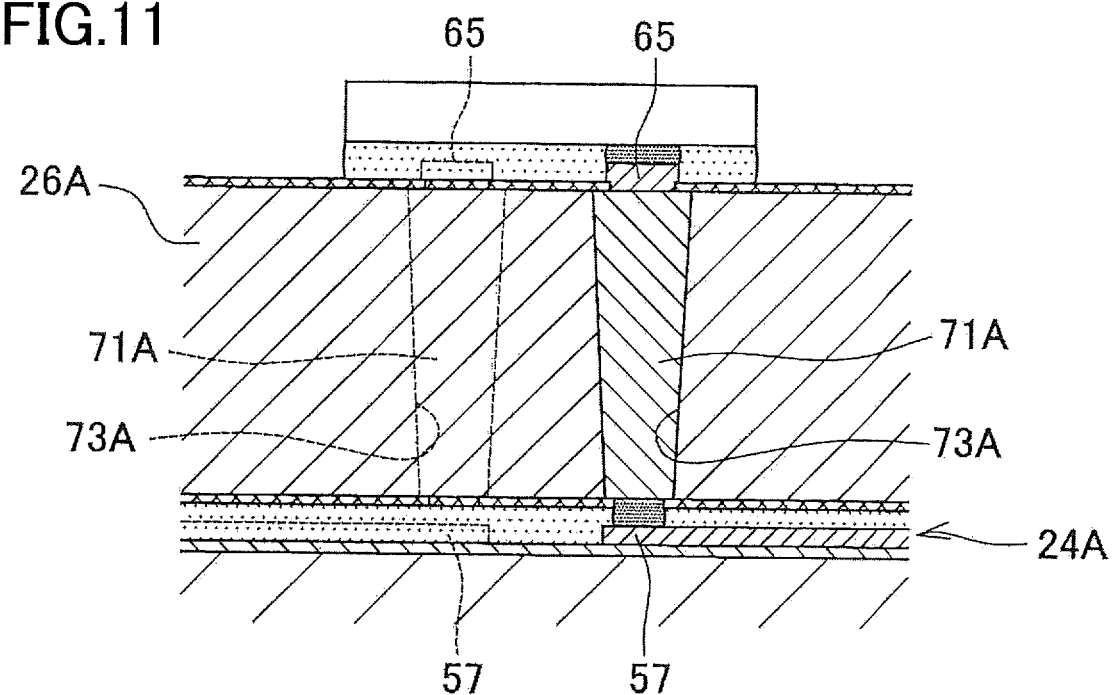
FIG. 11 is a cross-sectional view of a portion of a protector at which first through electrodes are formed in a modification.

As is apparent from FIG. 11, when comparing the driving contacts 57 located under the protector 26A and the individual terminal 65 located above the protector 24A with each other, there is a larger space for the individual terminal 65. Thus, the pitches of the individual terminals 65 can be increased more easily than those of the driving contacts 57. Conversely speaking, since it is difficult to increase the pitches of the driving contacts 57, the diameter of each of first through electrodes 71A is preferably smaller at its lower portion than at its upper portion to reliably prevent shorts at its lower end portion.

Figure 12:
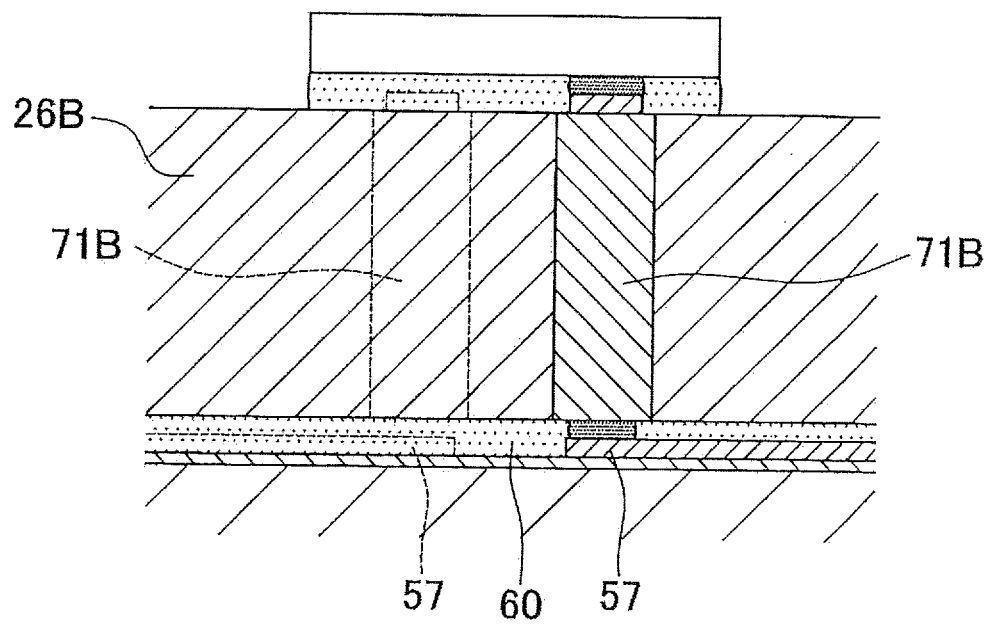
FIG. 12 is a cross-sectional view of a portion of a protector at which first through electrodes are formed in another modification.

In another modification, one or both of the insulating layer 75 covering the lower end faces of the first through electrodes 71 and the insulating layer 76 covering the upper end faces of the first through electrodes 71 in FIGS. 5-6B may be omitted. In FIG. 12, no insulating layer is formed on either of a lower surface and an upper surface of a protector 26B. In particular, the insulating layer 75 may be omitted in the case where the area of a lower end face of each of first through electrodes 71B is smaller than the area of a corresponding one of the driving contacts 57. The insulating layer 76 may be omitted in the case where the area of an upper end face of each of a first through electrodes 71B is smaller than the area of a corresponding one of the individual terminals 65.

In the above-described embodiment (see FIG. 3), the first ground terminals 67 connected to the common electrodes 49 and the second ground terminals 70 connected to the driver IC 37 are provided on the upper surface of the top wall 53 of the protector 26 as the ground terminals. In yet another modification, a single type of ground terminals may be formed instead of the first ground terminals 67 and the second ground terminals 70.

Figure 13:
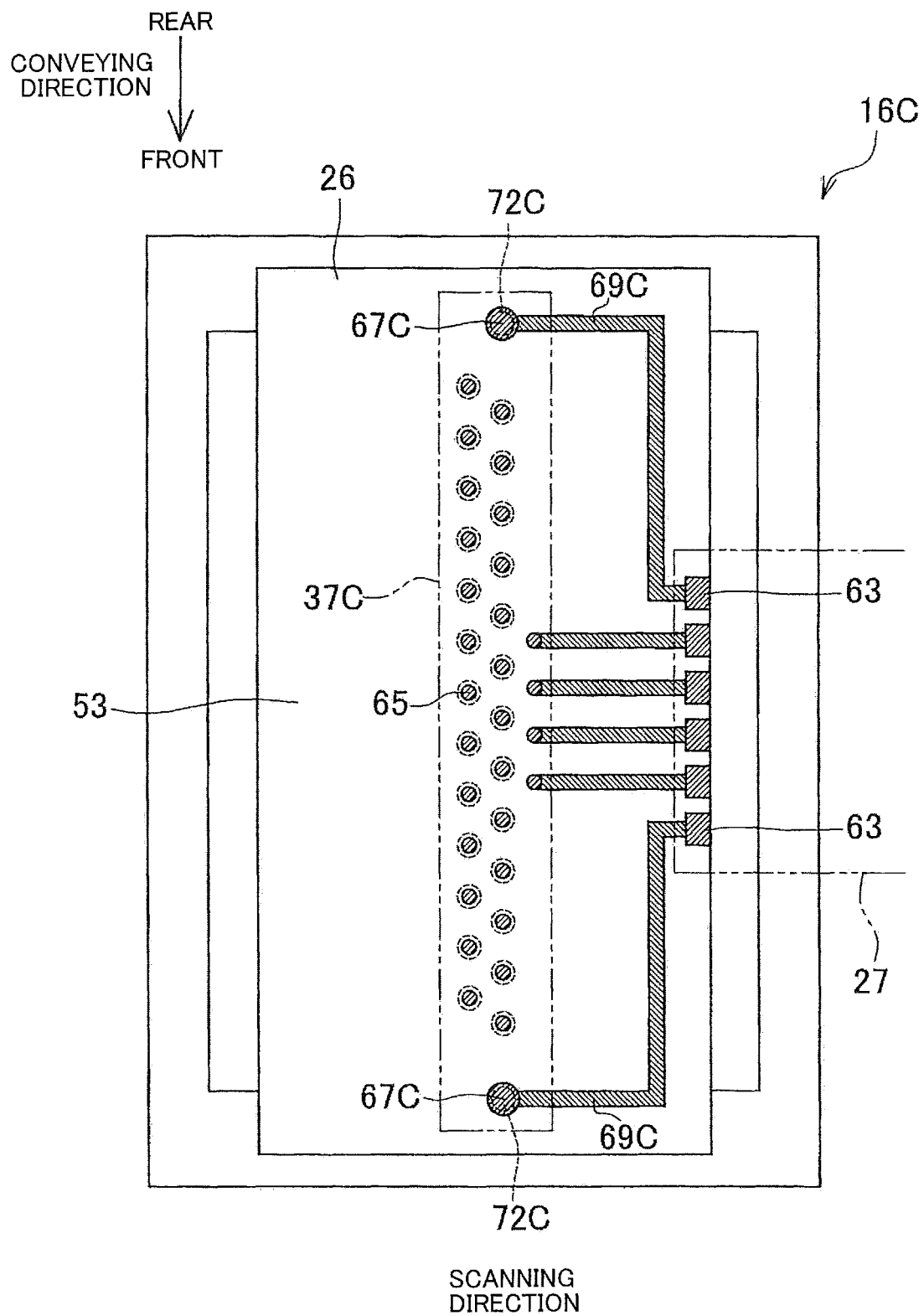
FIG. 13 is a top view of a head unit in yet another modification.

In a head unit 16C illustrated in FIG. 13, for example, two ground terminals 67C are respectively disposed on opposite sides of the individual terminals 65 in the front and rear direction. The ground terminals 67C are connected to the respective ground input terminals 63 by respective ground wires 69C formed on the upper surface of the top wall 53 of the protector 26. The ground terminals 67C are connected to the common electrodes by second through electrodes 72C formed in the protector 26. The ground terminals 67C are also connected to a driver IC 37C. In the construction illustrated in FIG. 13, the ground wires are simplified, and wiring is easy when compared with the construction illustrated in FIG. 3. In addition, the number of the terminals on the top wall 53 is reduced, resulting in reduced size of the protector 26.

In the above-described embodiment, as illustrated in FIG. 5, the driver IC 37 is disposed on the central portion of the top wall 53 in the right and left direction which is coupled to the separated wall 55, and the FPC 27 is joined to the end portion of the top wall 53 in the right and left direction which is coupled to the side wall 54. In yet another modification, both of the driver IC 37 and the FPC 27 may be disposed at a portion of the top wall 53 which is coupled to one of the side walls 54 or the separated wall 55.

Figure 14:
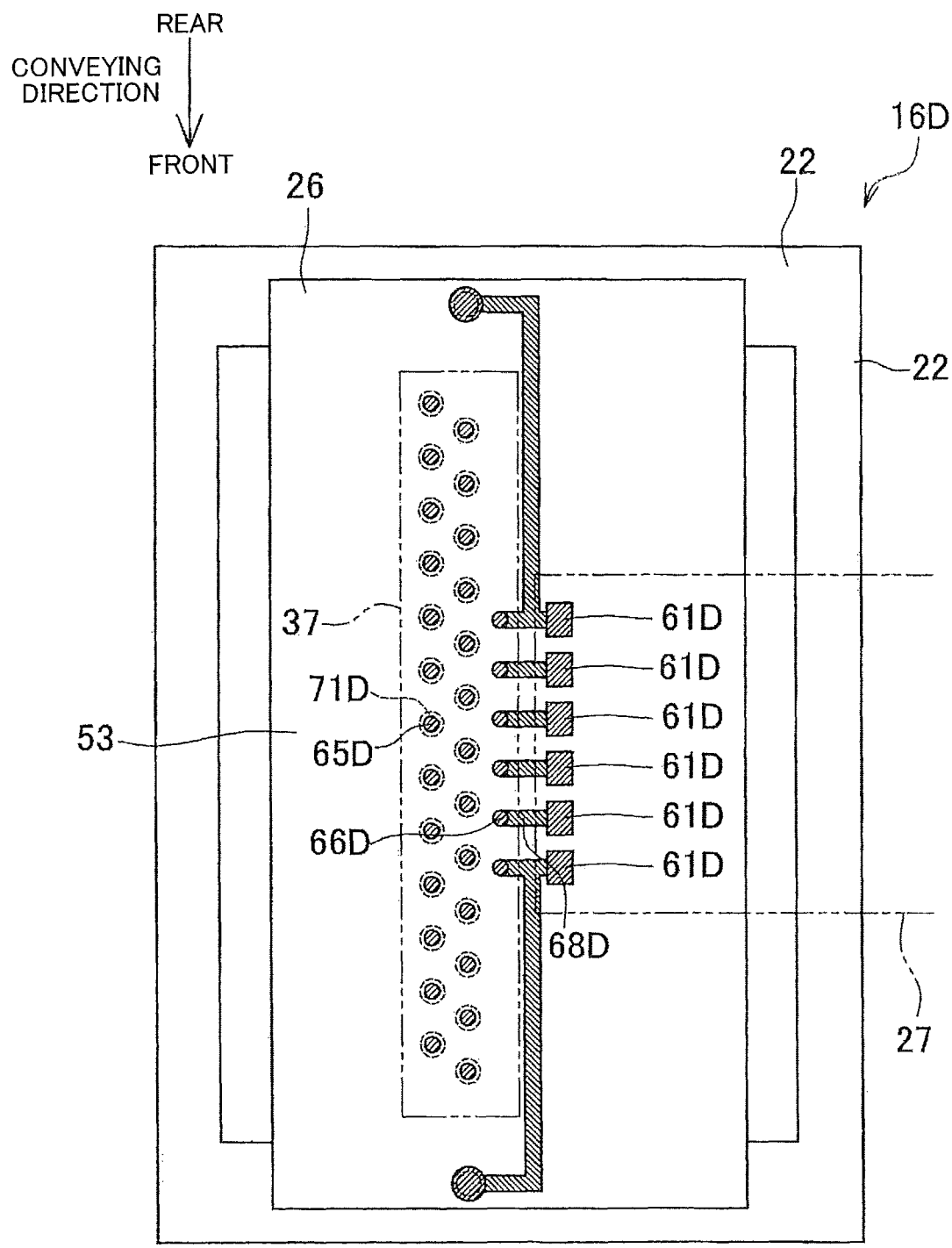
FIG. 14 is a top view of a head unit in yet another modification.
Figure 15:
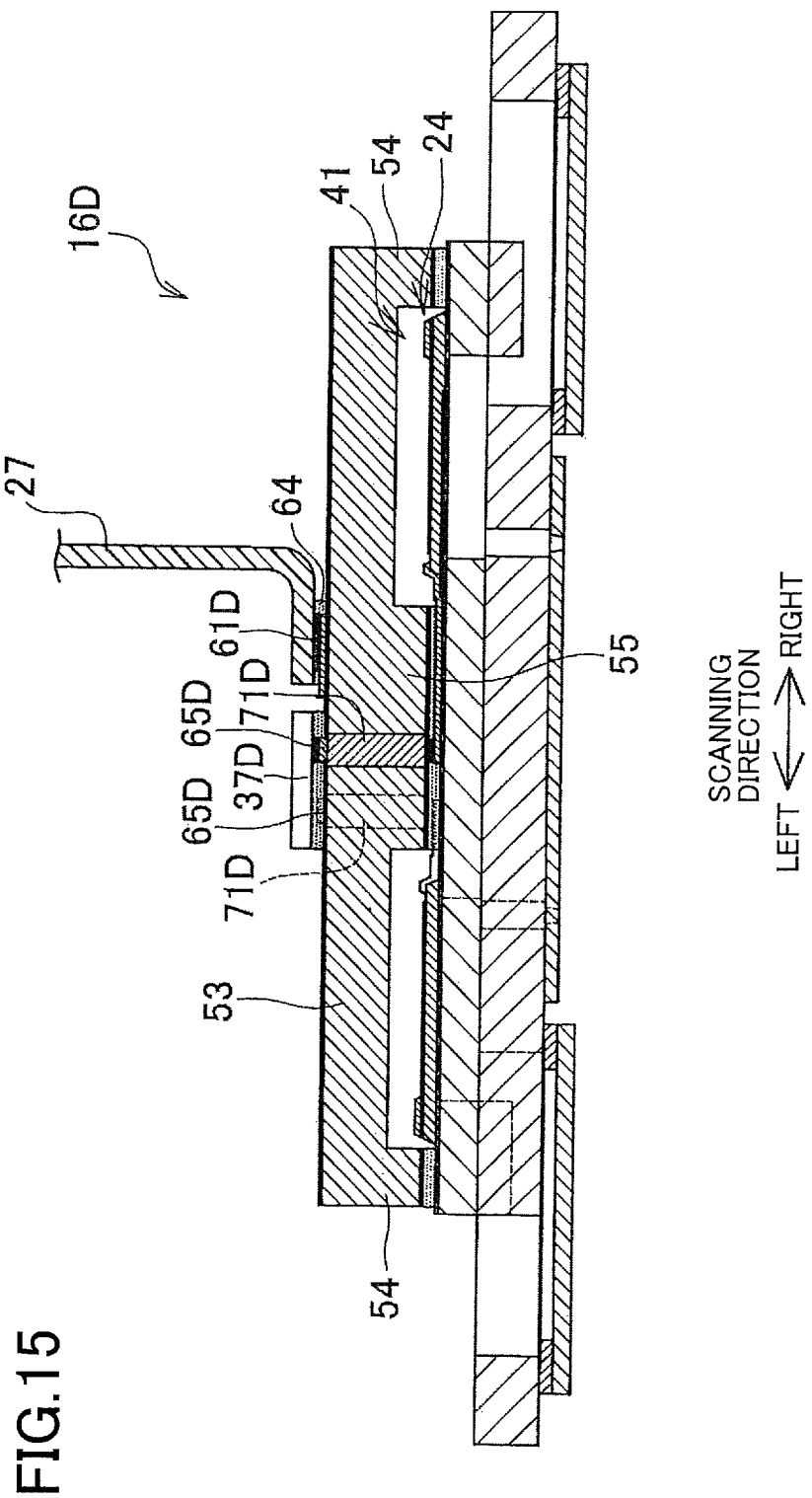
FIG. 15 is a cross-sectional view of the head unit in FIG. 14.

For example, in a head unit 16D illustrated in FIGS. 14 and 15, individual terminals 65D and signal terminals 66D are disposed at a left half portion of a coupled portion of the top wall 53 which is coupled to the separated wall 55, and input terminals 61D are disposed at a right half portion of the coupled portion. The driver IC 37 is disposed on the left half portion of the central portion of the top wall 53 and connected to the individual terminals 65D and the signal terminals 66D. The FPC 27 is joined to the right half portion of the central portion of the top wall 53 and connected to the input terminals 61D. First through electrodes 71D connected to the respective individual terminals 65D are disposed in a left half portion of the separated wall 55. That is, the driver IC 37, the individual terminals 65D, the signal terminals 66D, and the first through electrodes 71D are disposed to the left of the central portion of the separated wall 55.

In this modification as described above, the individual terminals 65D and the signal terminals 66D connected to the driver IC 37, and the input terminals 61D connected to the FPC 27 are disposed at the central portion of the top wall 53. This construction shortens the length of each of signal wires 68D that connect between the driver IC 37 (the signal terminals 66D) and the input terminals 61D when compared with the construction in the above-described embodiment (FIG. 3).

The signal wires 68D are formed on the surface of the top wall 53 of the protector 26 and exposed at least during the production of the protector 26. Thus, increase in the length of each of the signal wires 68D increases a possibility of occurrence of a problem such as breakage of the signal wires 68D during the process of producing the protector 26. Also, in the case where the protector is extended, contracted, or deformed due to changes in an external environment such as temperature and humidity, the long wire may cause adverse effects such as conduction failures, shorts, and increase or decrease in resistance of the wire. In the present modification, in contrast, the signal wires 68D are short, thereby eliminating these adverse effects.

Figure 16:
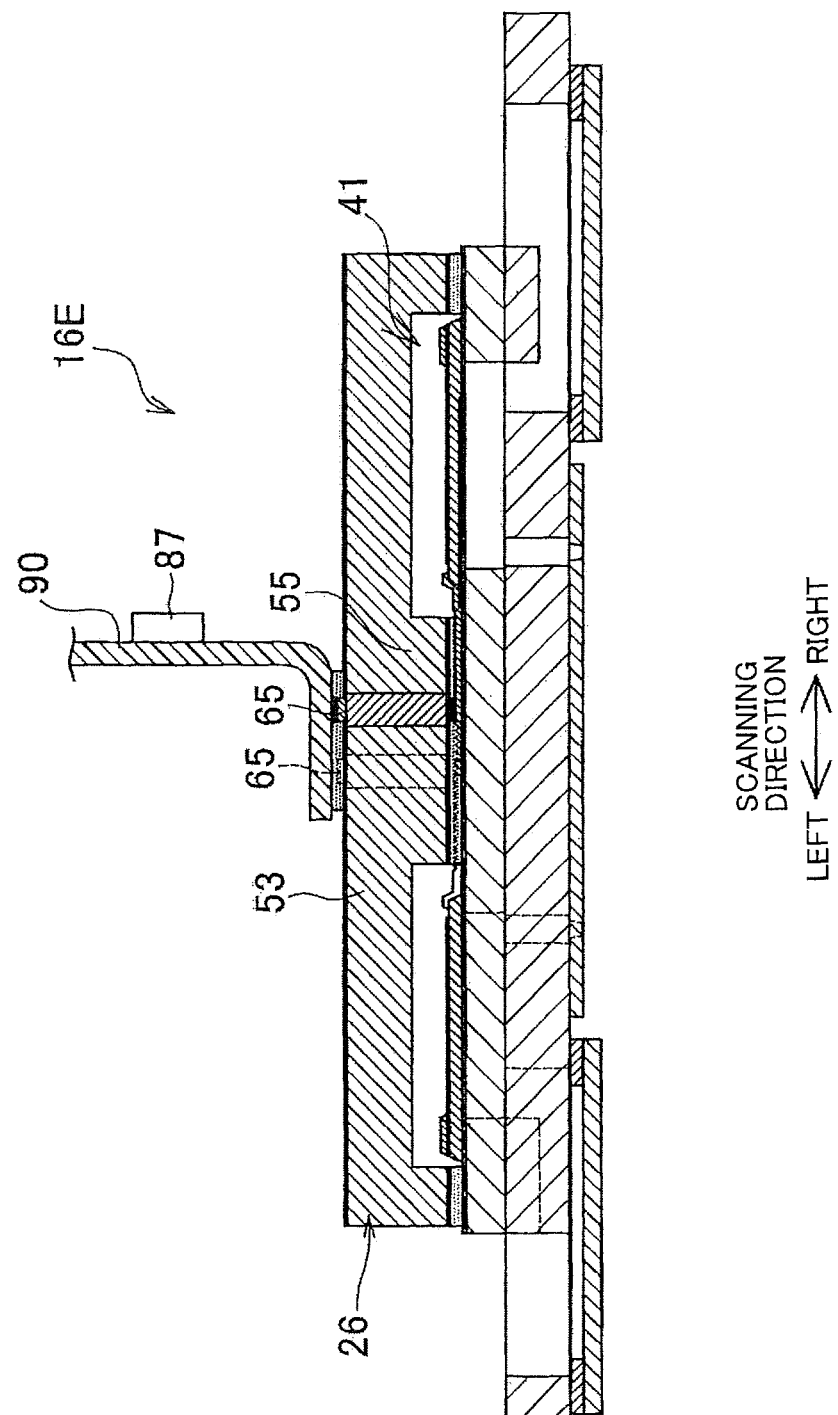
FIG. 16 is a cross-sectional view of a head unit in yet another modification.

In the above-described embodiment, as illustrated in FIG. 5, the driver IC 37 is disposed on the portion of the top wall 53 which is coupled to the separated wall 55 in which the first through electrodes 71 are formed. In contrast, as in a head unit 16E illustrated in FIG. 16 according to yet another modification, a chip-on-film (COF) 90 as a wiring member on which a driver IC 87 is mounted is joined to the portion of the top wall 53 which is coupled to the separated wall 55. The driver IC 87 is electrically connected to the individual terminals 65 to output drive signals to the piezoelectric elements 41. In the above-described embodiment, since the driver IC 37 and the FPC 27 are individually joined to the protector 26, two electrically connecting steps are required. In the construction in FIG. 16, however, the COF 90 only needs to be joined to the protector 26, making it possible to reduce the number of electrically connecting steps.

In the above-described embodiment, the protector 26 covers the two piezoelectric element rows 47 and includes not only the top wall 53 and the two side walls 54 but also the separated wall 55 located between the two piezoelectric element rows 47. In yet another modification in FIG. 17, in contrast, a protector 26F covers only one piezoelectric element row 47. That is, the protector 26F includes only a top wall 53F and two side walls 54Fa, 54Fb without including the separated wall. The first through electrodes 71 are formed in the left side wall 54Fa of the protector 26F. The driver IC 37 is disposed on a left end portion of the top wall 53F which is coupled to the side wall 54Fa. The FPC 27 is joined to a right end portion of the top wall 53F which is coupled to the right side wall 54Fb.

Figure 17:
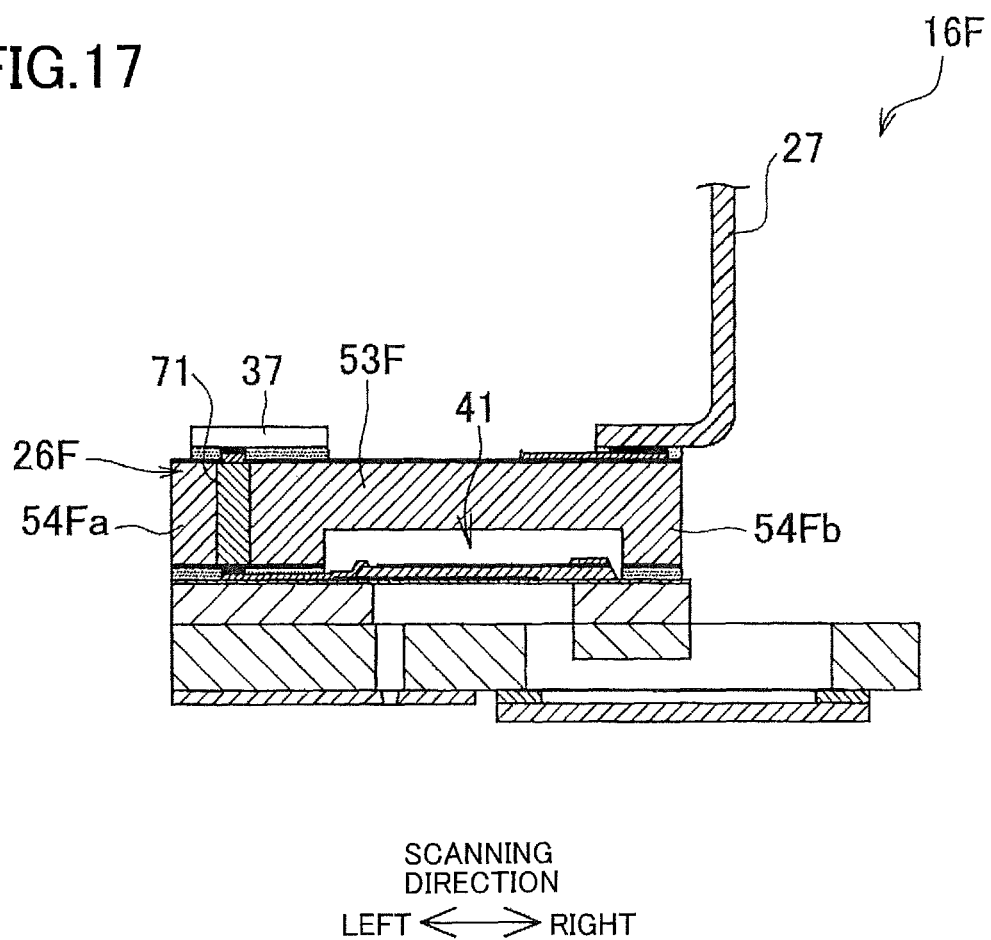
FIG. 17 is a cross-sectional view of a head unit in yet another modification.
Figure 18:
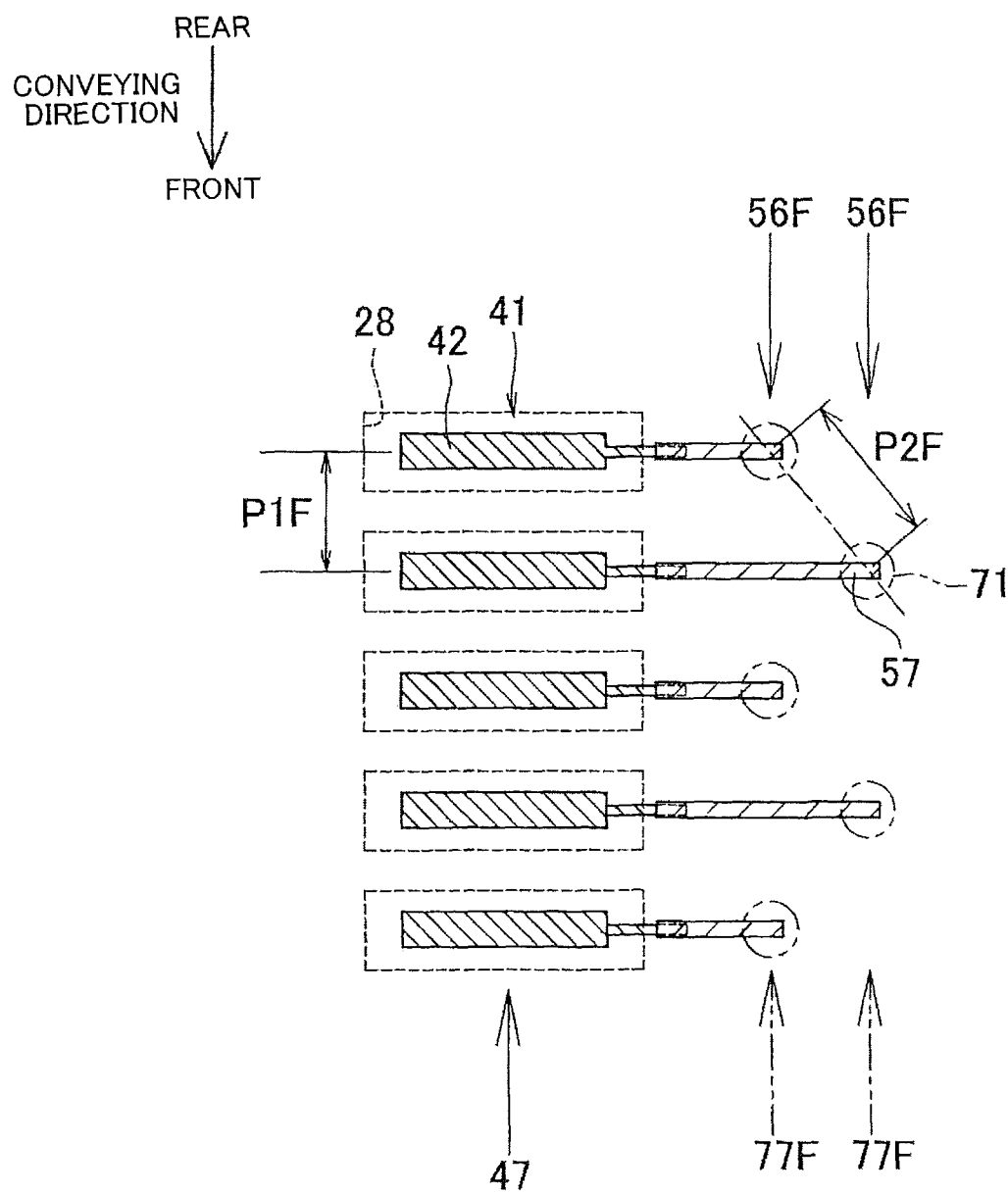
FIG. 18 is a view illustrating a positional relationship among the piezoelectric elements, the driving contacts, and the first through electrodes in the head unit in FIG. 17.

In the construction as illustrated in FIG. 17, the distance between the two adjacent first through electrodes 71 may be increased as follows. For example, in FIG. 18, the driving contacts 57 are drawn out rightward respectively from the piezoelectric elements 41 in one of the piezoelectric element rows 47. However, the driving contacts 57 are not arranged in a row in the front and rear direction but arranged in a staggered configuration so as to form two contact rows 56F. In accordance with this arrangement, the first through electrodes 71 are also arranged in a staggered configuration so as to form two electrode rows 77F. In this construction, a distance P2F between two of the first through electrodes 71 which are adjacent to each other in the front and rear direction is greater than the distance P1F between corresponding two of the piezoelectric elements 41 in the front and rear direction. This construction prevents shorts between the two first through electrodes 71 adjacent to each other.

Figure 19:
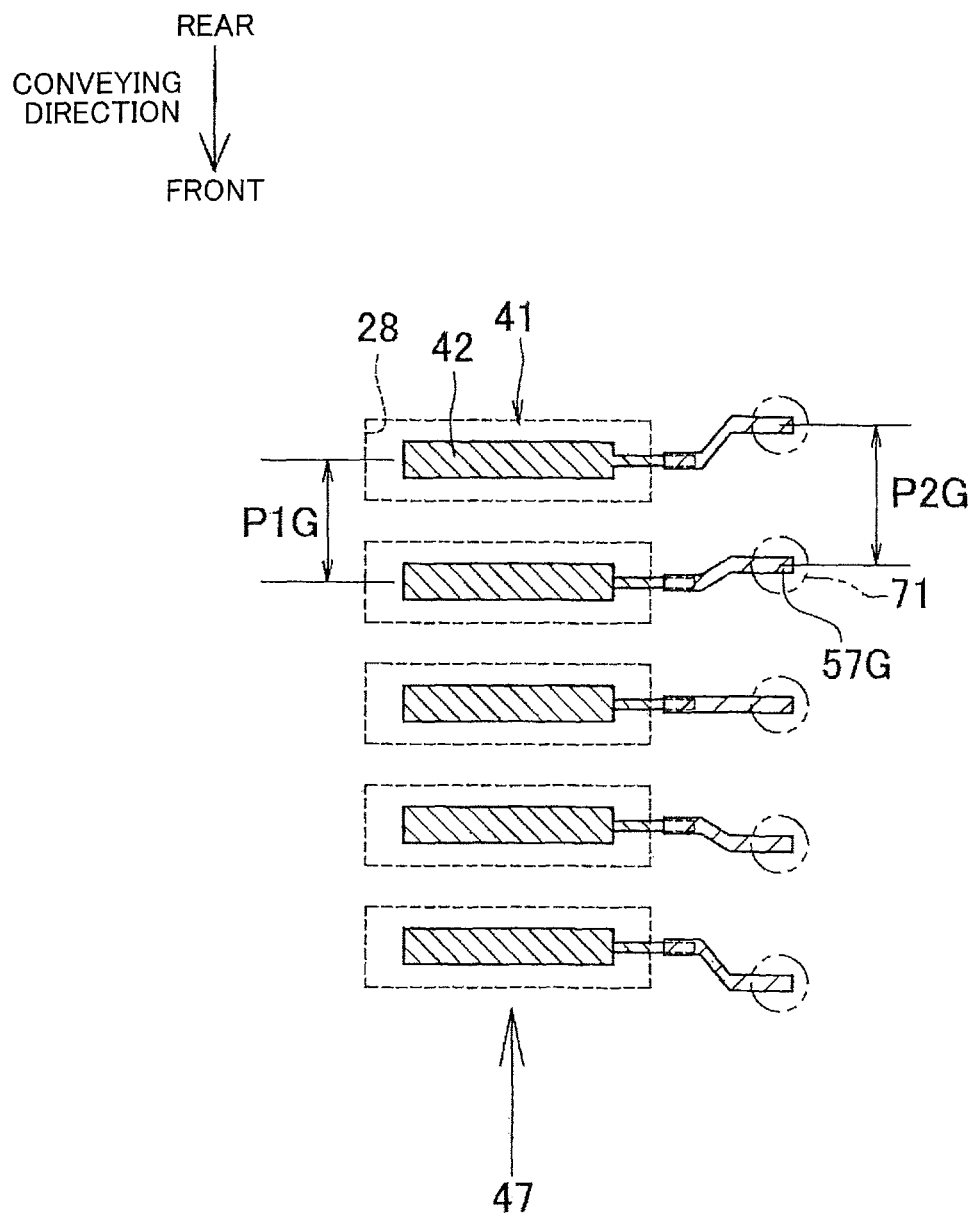
FIG. 19 is a view illustrating a positional relationship among the piezoelectric elements, driving contacts, and the first through electrodes in yet another modification.

In FIG. 19, a plurality of driving contacts 57G drawn out rightward from the respective piezoelectric elements 41 in one of the piezoelectric element rows 47 are arranged in a row. However, the driving contacts 57G are disposed so as to spread radially as a whole. Thus, the pitches P2G of the first through electrodes 71 corresponding to the respective piezoelectric elements 41 in the one piezoelectric element row 47 in the front and rear direction are greater than the pitches P1G of the piezoelectric elements 41 in the one piezoelectric element row 47 in the front and rear direction. This construction prevents shorts between the two first through electrodes 71 adjacent to each other.

In the above-described embodiment, as illustrated in FIGS. 5-6B, the driver IC 37 is disposed on the portion of the top wall 53 which is coupled to the separated wall 55 in which the first through electrodes 71 are formed. It is not essential that the driver IC 37 is disposed just above the first through electrodes 71, and the driver IC 37 may be disposed at a position spaced apart from the first through electrodes 71. In this construction, the driver IC 37 and the individual terminals 65 located just above the first through electrodes 71 are connected to each other by respective wires formed on the top wall 53.

The arrangement of the driving contacts for the piezoelectric actuator is not limited to that in the above-described embodiment. All the driving contacts for the piezoelectric elements may be drawn out in the same direction and arranged in a row at one end portion of the piezoelectric actuator. Alternatively, the printer 1 may be configured such that wires are drawn out from the two piezoelectric element rows toward opposite sides in the scanning direction, and driving contacts are arranged in each of opposite end portions of the piezoelectric actuator in the scanning direction.

There will be explained, with reference to FIG. 20, arrangement of through electrodes, terminals, wires, and other similar components formed in and on the protector in the construction in which the driving contacts are drawn out from the two piezoelectric element rows in the right and left direction. In a head unit 16H illustrated in FIG. 20, two side walls 54H of a protector 26H are joined to right and left end portions of a piezoelectric actuator on which driving contacts are disposed. A plurality of first through electrodes 71H and two second through electrodes 72H are formed on each of the side walls 54H. Individual terminals 65H conductive with the respective first through electrodes 71H and two ground terminals 67H conductive with the respective two second through electrodes 72H are formed on each of a left end portion and a right end portion of a top wall 53H which are coupled to the respective side walls 54H.

A driver IC 37H is disposed on a central portion of the top wall 53H in the right and left direction which is coupled to a separated wall 55H. The driver IC 37H is connected to the individual terminals 65H disposed on the left end portion and the right end portion of the top wall 53H, respectively by individual wires 68H and connected to the ground terminals 67H respectively by ground wires 69H.

Figure 20:
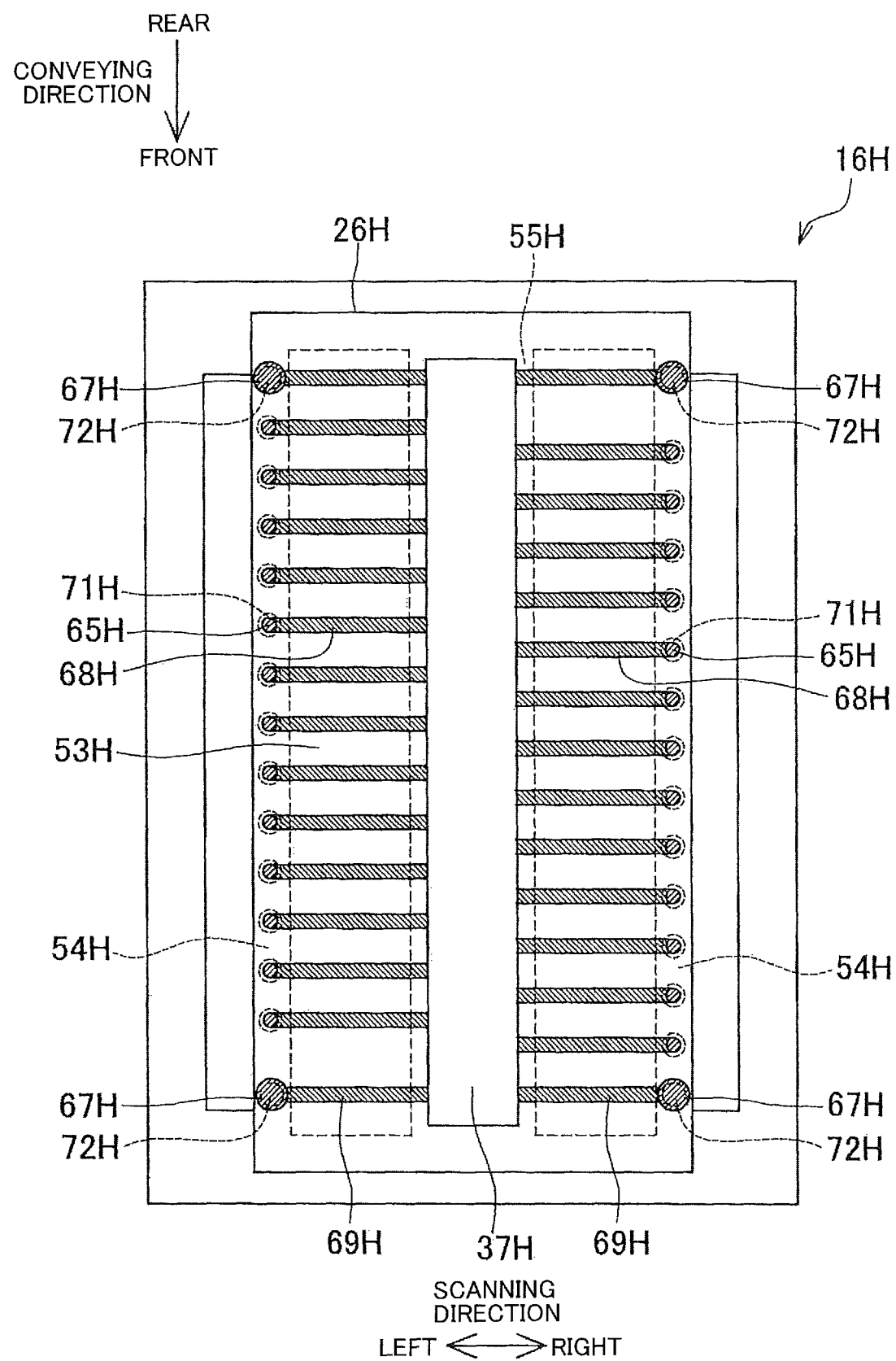
FIG. 20 is a top view of the head unit in yet another modification.

In the construction in FIG. 20, two rows of the first through electrodes 71H which correspond to the respective two piezoelectric element rows are disposed on the right and left side walls 54H corresponding to the respective two rows. This construction increases the distance between each two of the first through electrodes 71 which are adjacent to each other in the front and rear direction when compared with the construction illustrated in FIG. 7 in the above-described embodiment. It is noted that a wiring member (COF) on which the driver IC is mounted may be joined to the separated wall 55H instead of the construction in FIG. 20 in which the driver IC 37H is disposed just above the separated wall 55H.

The protector 26 is joined to the piezoelectric actuator 24 with the conductive adhesive 60 in the above-described embodiment but may be joined to the piezoelectric actuator 24 with non-conductive adhesive (NCF or NCP).

The ink-jet head 4 in the above-described embodiment is a serial head configured to eject the ink while moving in the widthwise direction of the recording sheet 100. However, the present disclosure may be applied to a line head having nozzles arranged in the widthwise direction of the sheet.

While the present disclosure is applied to the ink-jet head configured to eject the ink onto the recording sheet to record an image in the above-described embodiment, the present disclosure may be applied to actuator devices used for purposes other than liquid ejection. Also, the actuator is not limited to the piezoelectric actuator including a plurality of piezoelectric elements. For example, the actuator may be an actuator including a heater as a drive element which causes driving by utilizing a heat generated when a current passes through the heater.

What is claimed is:

1. An actuator device, comprising:
an actuator comprising a plurality of piezoelectric elements arranged in a first direction and a plurality of first contacts respectively drawn from the plurality of piezoelectric elements and arranged in the first direction;
a protector configured to cover the plurality of piezoelectric elements;
a plurality of first connection terminals disposed on a surface of the protector, which surface is located on an opposite side of the protector from the actuator; and
a plurality of first through electrodes respectively provided in a plurality of first through holes formed in the protector, the plurality of first through electrodes being configured to respectively bring the plurality of first contacts and the plurality of first connection terminals into conduction with each other,
wherein a distance between two of the plurality of first through electrodes which respectively correspond to particular two of the plurality of piezoelectric elements, which are nearest to each other in the first direction among the plurality of piezoelectric elements, is greater than a distance in the first direction between the particular two of the plurality of piezoelectric elements,
wherein each of the plurality of piezoelectric elements comprises a piezoelectric layer, a first electrode, and a second electrode, and the piezoelectric layer is interposed between the first electrode and the second electrode in a thickness direction of the piezoelectric layer,
wherein a plurality of the first electrodes of the plurality of piezoelectric elements are separated from each other, and a plurality of the second electrodes of the plurality of piezoelectric elements conduct with each other so as to form a common electrode,
wherein each of the plurality of first contacts is connected to a corresponding one of the plurality of the first electrodes of the plurality of piezoelectric elements,
wherein the actuator comprises at least one second contact connected to the common electrode,
wherein the actuator device further comprises:
at least one second connection terminal disposed on the surface of the protector, which surface is located on the opposite side of the protector from the actuator; and
at least one second through electrode provided in at least one second through hole formed in the protector, the at least one second through electrode being configured to bring the at least one second contact and the at least one second connection terminal into conduction with each other,
wherein a diameter of each of the plurality of first through holes formed in the protector is equal to a diameter of each of the at least one second through hole formed in the protector, and
wherein, in a case where a thickness of the protector is defined as t, a diameter of each of the plurality of first through holes is equal to or greater than t/10.

2. An actuator device, comprising:
an actuator comprising a plurality of piezoelectric elements arranged in a first direction and a plurality of first contacts respectively drawn from the plurality of piezoelectric elements and arranged in the first direction;
a protector configured to cover the plurality of piezoelectric elements;
a plurality of first connection terminals disposed on a surface of the protector, which surface is located on an opposite side of the protector from the actuator; and
a plurality of first through electrodes respectively provided in a plurality of first through holes formed in the protector, the plurality of first through electrodes being configured to respectively bring the plurality of first contacts and the plurality of first connection terminals into conduction with each other,
wherein a distance between two of the plurality of first through electrodes which respectively correspond to particular two of the plurality of piezoelectric elements, which are nearest to each other in the first direction among the plurality of piezoelectric elements, is greater than a distance in the first direction between the particular two of the plurality of piezoelectric elements,
wherein each of the plurality of piezoelectric elements comprises a piezoelectric layer, a first electrode, and a second electrode, and the piezoelectric layer is interposed between the first electrode and the second electrode in a thickness direction of the piezoelectric layer,
wherein a plurality of the first electrodes of the plurality of piezoelectric elements are separated from each other, and a plurality of the second electrodes of the plurality of piezoelectric elements conduct with each other so as to form a common electrode, wherein each of the plurality of first contacts is connected to a corresponding one of the plurality of the first electrodes of the plurality of piezoelectric elements, wherein the actuator comprises at least one second contact connected to the common electrode, wherein the actuator device further comprises:
- at least one second connection terminal disposed on the surface of the protector, which surface is located on the opposite side of the protector from the actuator; and
- at least one second through electrode provided in at least one second through hole formed in the protector, the at least one second through electrode being configured to bring the at least one second contact and the at least one second connection terminal into conduction with each other, wherein a diameter of each of the plurality of first through holes formed in the protector is equal to a diameter of each of the at least one second through hole formed in the protector, and wherein a diameter of each of the plurality of first through holes is equal to or greater than 40 μm.

3. The actuator device according to claim 1,
wherein the actuator comprises a plurality of second contacts as the at least one second contact,
wherein a plurality of second connection terminals as the at least one second connection terminal are provided on the protector, and
wherein a plurality of second through electrodes as the at least one second through electrode are provided on the protector, and the plurality of second through electrodes are respectively configured to bring the plurality of second contacts and the plurality of second connection terminals into conduction with each other.

4. The actuator device according to claim 1,
wherein the plurality of piezoelectric elements form two piezoelectric element rows arranged side by side in a second direction that is parallel with a plane on which the plurality of piezoelectric elements are arranged and that is orthogonal to the first direction,
wherein a plurality of piezoelectric elements in each of the two piezoelectric element rows are arranged in the first direction,
wherein the plurality of first contacts are drawn outward in the second direction from the plurality of piezoelectric elements arranged in the two piezoelectric element rows, and
wherein the plurality of first through electrodes conductive with the plurality of first contacts are provided outside a portion of the protector which is located between the two piezoelectric elements rows in the second direction.

5. The actuator device according to claim 1,
wherein the protector and the actuator are joined to each other with conductive adhesive containing a conductive particle.

6. An actuator device, comprising:
an actuator comprising a plurality of piezoelectric elements arranged in a first direction and a plurality of first contacts respectively drawn from the plurality of piezoelectric elements and arranged in the first direction;
a protector configured to cover the plurality of piezoelectric elements;
a plurality of first connection terminals disposed on a surface of the protector, which surface is located on an opposite side of the protector from the actuator; and
a plurality of first through electrodes respectively provided in a plurality of first through holes formed in the protector, the plurality of first through electrodes being configured to respectively bring the plurality of first contacts and the plurality of first connection terminals into conduction with each other, wherein a distance between two of the plurality of first through electrodes which respectively correspond to particular two of the plurality of piezoelectric elements, which are nearest to each other in the first direction among the plurality of piezoelectric elements, is greater than a distance in the first direction between the particular two of the plurality of piezoelectric elements, wherein each of the plurality of piezoelectric elements comprises a piezoelectric layer, a first electrode, and a second electrode, and the piezoelectric layer is interposed between the first electrode and the second electrode in a thickness direction of the piezoelectric layer, wherein a plurality of the first electrodes of the plurality of piezoelectric elements are separated from each other, and a plurality of the second electrodes of the plurality of piezoelectric elements conduct with each other so as to form a common electrode, wherein each of the plurality of first contacts is connected to a corresponding one of the plurality of the first electrodes of the plurality of piezoelectric elements, wherein the actuator comprises at least one second contact connected to the common electrode, wherein the actuator device further comprises:
- at least one second connection terminal disposed on the surface of the protector, which surface is located on the opposite side of the protector from the actuator; and
- at least one second through electrode provided in at least one second through hole formed in the protector, the at least one second through electrode being configured to bring the at least one second contact and the at least one second connection terminal into conduction with each other, wherein a diameter of each of the plurality of first through holes formed in the protector is equal to a diameter of each of the at least one second through hole formed in the protector, wherein the protector and the actuator are joined to each other with conductive adhesive containing a conductive particle, and wherein a thickness of the conductive adhesive is less than a thickness of each of the plurality of piezoelectric elements in the thickness direction.

7. The actuator device according to claim 1,
wherein the plurality of first contacts are respectively disposed right below the plurality of the first through holes.

8. The actuator device according to claim 1,
wherein the plurality of first through electrodes form a first electrode row and a second electrode row arranged side by side in a second direction that is parallel with a plane on which the plurality of piezoelectric elements are arranged and that is orthogonal to the first direction,
wherein a plurality of first through electrodes in the first electrode row are arranged in the first direction, and a plurality of first through electrodes in the second electrode row are arranged in the first direction,
wherein each of the plurality of first through electrodes in the first electrode row is different, in position in the first direction, from a corresponding one of the plurality of first through electrodes in the second electrode row, and wherein a distance between a center of each of the plurality of first through electrodes in the first electrode row and a center of a corresponding one of the plurality of first through electrodes in the second electrode row in a direction of a straight line connecting between the center of said each of the plurality of first through electrodes in the first electrode row and the center of a corresponding one of the plurality of first through electrodes in the second electrode row is greater than a distance in the first direction between said each of the plurality of first through electrodes in the first electrode row and the corresponding one of the plurality of first through electrodes in the second electrode row.

9. The actuator device according to claim 1, further comprising a first insulating layer provided on a surface of the protector, which surface is joined to the actuator,
   wherein the first insulating layer covers an actuator-side end face of each of the plurality of first through electrodes, and
   wherein the first insulating layer comprises a hole smaller than the actuator-side end face of each of the plurality of first through electrodes.

10. The actuator device according to claim 9,
    wherein an area of the actuator-side end face of each of the plurality of first through electrodes is greater than an area of each of the plurality of first contacts.

11. The actuator device according to claim 1, further comprising a second insulating layer provided on the surface of the protector, which surface is located on the opposite side of the protector from the actuator,
    wherein the second insulating layer covers an opposite-side end face of each of the plurality of first through electrodes, which end face is located on an opposite side of said each of the plurality of first through electrodes from the actuator, and
    wherein the second insulating layer comprises a hole smaller than the opposite-side end face of each of the plurality of first through electrodes.

12. The actuator device according to claim 1,
    wherein each of the plurality of first through holes formed in the protector tapers down toward the actuator.

* * * * *